US012068336B2

(12) United States Patent
Jeon et al.

(10) Patent No.: US 12,068,336 B2
(45) Date of Patent: Aug. 20, 2024

(54) DISPLAY DEVICE INCLUDING CONNECTION PATTERN AND METHOD OF MANUFACTURING THE SAME

(71) Applicant: Samsung Display Co., LTD., Yongin-si (KR)

(72) Inventors: Kyung Jin Jeon, Incheon (KR); So Young Koo, Hwaseong-si (KR); Eok Su Kim, Seoul (KR); Hyung Jun Kim, Seoul (KR); Yun Yong Nam, Hwaseong-si (KR); Jun Hyung Lim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 119 days.

(21) Appl. No.: 17/469,217

(22) Filed: Sep. 8, 2021

(65) Prior Publication Data

US 2022/0165759 A1 May 26, 2022

(30) Foreign Application Priority Data

Nov. 24, 2020 (KR) ........................ 10-2020-0158571

(51) Int. Cl.
*H01L 27/12* (2006.01)
*G02F 1/1362* (2006.01)
*H01L 25/16* (2023.01)

(52) U.S. Cl.
CPC .... *H01L 27/1288* (2013.01); *G02F 1/136227* (2013.01); *H01L 25/167* (2013.01); *H01L 27/124* (2013.01); *H01L 27/1248* (2013.01)

(58) Field of Classification Search
None
See application file for complete search history.

(56) References Cited

U.S. PATENT DOCUMENTS

| 2017/0345882 | A1* | 11/2017 | Nam ..................... H10K 59/123 |
| 2019/0164955 | A1* | 5/2019 | Andou ................ H01L 27/0296 |
| 2019/0181360 | A1* | 6/2019 | Cha ......................... H10K 71/00 |

FOREIGN PATENT DOCUMENTS

| KR | 10-1947007 | 2/2019 |
| KR | 10-2019-0070384 | 6/2019 |
| KR | 10-2020-0034896 | 4/2020 |
| KR | 10-2020-0068150 | 6/2020 |

* cited by examiner

*Primary Examiner* — Lauren Nguyen
(74) *Attorney, Agent, or Firm* — KILE PARK REED & HOUTTEMAN PLLC

(57) ABSTRACT

A display device and a method of manufacturing a display device are provided. The display device includes a first conductive layer on a substrate, a passivation layer disposed on the first conductive layer and exposing at least a part of the first conductive layer, a second conductive layer disposed on the passivation layer and covering an upper surface of the passivation layer, a via layer on the second conductive layer, a third conductive layer including a first electrode, a second electrode, and a connection pattern, and spaced apart from each other on the via layer, and a light emitting element having ends that are disposed on the first electrode and the second electrode, respectively. The connection pattern electrically connects the first conductive layer and the second conductive layer through a first contact hole penetrating the via layer.

19 Claims, 29 Drawing Sheets

DISPLAY DEVICE INCLUDING CONNECTION PATTERN AND METHOD OF MANUFACTURING THE SAME

CROSS-REFERENCE TO RELATED APPLICATION(S)

This application claims priority to and benefits of Korean Patent Application No. 10-2020-0158571 under 35 U.S.C. § 119, filed on Nov. 24, 2020, in the Korean Intellectual Property Office, the entire contents of which are incorporated herein by reference.

BACKGROUND

1. Technical Field

The embodiment relates to a display device and a method of manufacturing the same.

2. Description of the Related Art

The importance of a display device has increased with advances in multimedia. Accordingly, a variety of display devices such as an organic light emitting displays (OLEDs) and a liquid crystal displays (LCDs) have been used.

A display device is a device for displaying an image, and includes a display panel such as a light emitting display panel or a liquid crystal display panel. Among them, the light emitting display panel may include a light emitting element such as a light emitting diode (LED). Examples of the light emitting diode (LED) may include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the embodiment provide a method of manufacturing a display device having improved process efficiency and a display device manufactured using the method.

According to an aspect, a display device may include a first conductive layer disposed on a substrate, a passivation layer disposed on the first conductive layer and exposing at least a part of the first conductive layer, a second conductive layer disposed on the passivation layer and covering an upper surface of the passivation layer, a via layer disposed on the second conductive layer, a third conductive layer including a first electrode, a second electrode, and a connection pattern spaced apart from each other on the via layer, and a light emitting element having ends that are disposed on the first electrode and the second electrode, respectively. The connection pattern may electrically connect the first conductive layer and the second conductive layer through a first contact hole penetrating the via layer.

In an embodiment, the first contact hole may expose at least a part of the first conductive layer and at least a part of the second conductive layer.

In an embodiment, the first contact hole may expose an upper surface of the second conductive layer and a sidewall of the second conductive layer.

In an embodiment, the first contact hole may expose a sidewall of the passivation layer disposed between the first conductive layer and the second conductive layer.

In an embodiment, the first contact hole may expose an upper surface of the first conductive layer.

In an embodiment, at least a part of the second conductive layer and at least a part of the passivation layer may overlap the first conductive layer.

In an embodiment, the second conductive layer may expose at least a part of the first conductive layer.

In an embodiment, a sidewall of the second conductive layer may be aligned in parallel to a sidewall of the passivation layer.

In an embodiment, the first contact hole may include a first portion formed by a sidewall of the via layer, a second portion formed by a sidewall of the second conductive layer and the sidewall of the via layer, and a third portion formed by one sidewall of the passivation layer and the sidewall of the via layer. The first portion of the first contact hole, the second portion of the first contact hole, and the third portion of the first contact hole may overlap each other in a thickness direction of the substrate.

In an embodiment, a width of the first portion of the first contact hole may be greater than a width of the second portion of the first contact hole and greater than a width of the third portion of the first contact hole.

In an embodiment, the first portion of the first contact hole, the second portion of the first contact hole, and the third portion of the first contact hole may be integral with each other and form one hole.

In an embodiment, the third portion of the first contact hole may not overlap the second conductive layer in the thickness direction of the substrate.

In an embodiment, the passivation layer may be disposed between the second conductive layer and the first conductive layer.

In an embodiment, the display device may include a semiconductor layer disposed on the substrate, a gate insulating layer disposed on the semiconductor layer, a gate conductive layer disposed on the gate insulating layer, and an interlayer insulating layer disposed on the gate conductive layer. The first conductive layer may be disposed on the interlayer insulating layer.

In an embodiment, the first conductive layer may include a first source/drain electrode of a transistor. The semiconductor layer may include an active layer of the transistor. The first source/drain electrode of the transistor may be electrically connected to the active layer of the transistor through a second contact hole penetrating the interlayer insulating layer.

In an embodiment, the second contact hole may overlap the first source/drain electrode of the transistor and may overlap the active layer of the transistor.

In an embodiment, the first conductive layer may include a first source/drain electrode of a transistor. The semiconductor layer may include an active layer of the transistor. The first source/drain electrode of the transistor may be electrically connected to the active material layer of the transistor through a second contact hole penetrating the via layer and the interlayer insulating layer.

In an embodiment, the second contact hole does not overlap the first source/drain electrode of the transistor, and overlaps the active layer of the transistor.

According to an embodiment, a method of manufacturing a display device may include forming a first conductive layer on a surface of a substrate, depositing a passivation material layer on the first conductive layer, depositing a conductive material layer on the passivation material layer, forming a first mask pattern on the conductive material layer, etching the conductive material layer and the passivation material layer using the first mask pattern to form a second conductive layer and a passivation layer, forming a via layer on the second conductive layer, forming a third conductive layer on the via layer, the third conductive layer including a first electrode, a second electrode, and a connection pattern spaced apart from each other, and disposing a light emitting element such that an end of the light emitting element is disposed on the first electrode and another end of the light emitting element is disposed the second electrode. The connection pattern may electrically connect the first conductive layer and the second conductive layer through a first contact hole penetrating the via layer.

In an embodiment, the second conductive layer may cover an upper surface of the passivation layer. The first contact hole may expose at least a part of the first conductive layer and may expose a at least part of the second conductive layer.

The display device according to the embodiment may include a passivation layer and a second conductive layer formed in the same pattern on a first conductive layer. Since the first conductive layer and the second conductive layer may be electrically connected to each other through a site contact using a third conductive layer, it is possible to prevent layers disposed under the third conductive layer from being damaged, and it is possible to improve manufacturing process efficiency.

In the method of manufacturing a display device according to the embodiment, a via layer having a different height for each region may be formed through one mask process using a halftone mask, so that the via layer of the embodiment may simultaneously perform a step compensation function for compensating for a lower step difference and a bank function for arranging light emitting elements. Accordingly, an additional mask process of forming a separate bank on the via layer may be omitted, thereby improving process efficiency of the display device.

The passivation layer and the second conductive layer, disposed on the first conductive layer, may be formed in the same pattern by a single mask process. Although the passivation layer does not include a separate contact hole penetrating the passivation layer and connecting the second conductive layer and the first conductive layer, the third conductive layer disposed on the via layer may connect the first conductive layer and the second conductive layer to each other through side contacts through the contact holes penetrating the via layer. Accordingly, as the third conductive layer is used as a connection electrode connecting the first conductive layer and the second conductive layer, a separate mask process for forming a contact hole penetrating the passivation layer and connecting the first conductive layer and the second conductive layer may be omitted. As the passivation layer is formed in the same pattern through the same mask process as the second conductive layer, an additional mask process for forming multiple contact holes for connecting the first to third conductive layers to each other is not required, and it is possible to prevent damage to the surfaces of the first conductive layer, the passivation layer, and the second conductive layer.

The effects of the embodiments are not limited by the foregoing, and other various effects are anticipated herein.

Aspects of the embodiment are not restricted to those set forth herein. The above and other aspects of the embodiment will become more apparent to one of ordinary skill in the art to which the embodiment pertains by referencing the detailed description of the embodiment given below.

BRIEF DESCRIPTION OF THE DRAWINGS

The above and other aspects and features of the embodiment will become more apparent by describing in detail embodiments thereof with reference to the attached drawings, in which.

DETAILED DESCRIPTION OF THE EMBODIMENTS

Figure 1:
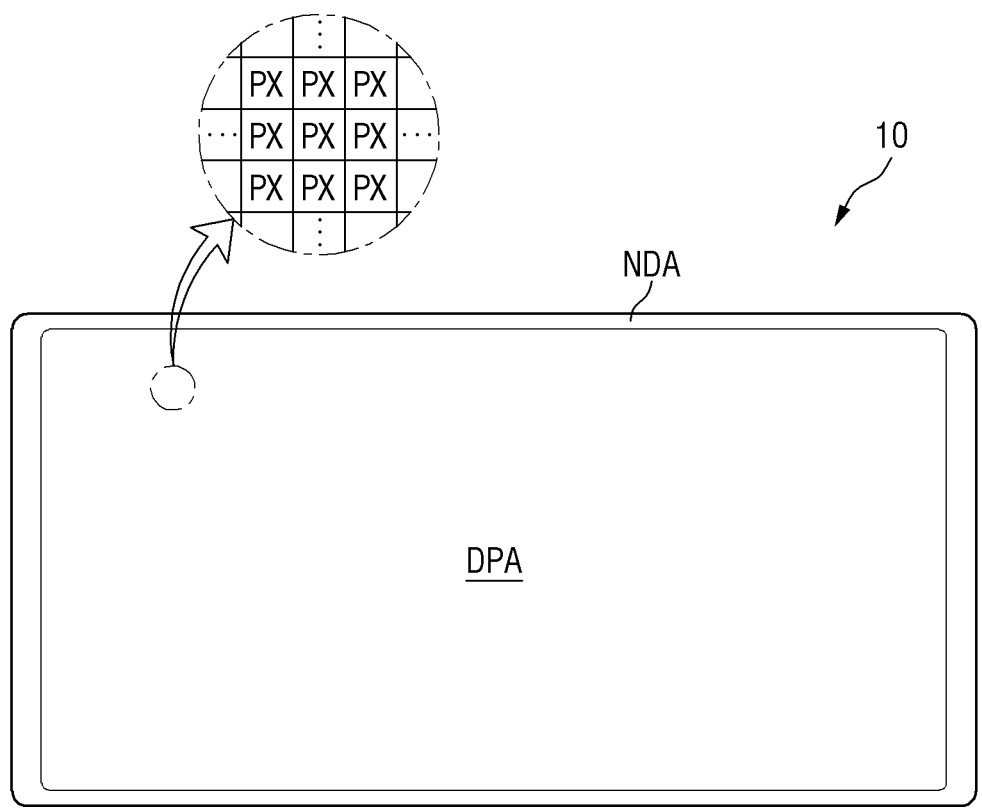
FIG. 1 is a schematic plan view of a display device according to an embodiment.

The embodiment will now be described more fully hereinafter with reference to the accompanying drawings, in which embodiments are shown. This embodiment may, however, be embodied in different forms and should not be construed as limited to the embodiments set forth herein. Rather, these embodiments are provided so that this disclosure will be thorough and complete, and will fully convey the scope of the embodiment to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the embodiment. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the attached drawings.

FIG. 1 is a schematic plan view of a display device according to an embodiment.

Referring to FIG. 1, a display device 10 displays a mobile image or a still image. The display device 10 may refer to any electronic device that provides a display screen. Examples of the display device 10 may include televisions, notebook computers, monitors, billboards, things of internet (IoTs), mobile phones, smart phones, tablet personal computers (tablet PCs), electronic watches, smart watches, watch phones, head mount displays, mobile communication terminals, electronic notebooks, electronic books, portable multimedia players (PMPs), navigators, game machines, digital cameras, and camcorders.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be described as an example, but the embodiments are not limited thereto. Other display panels may be applied as long as the same technical spirit is applicable.

In the drawings of embodiments for explaining the display device 10, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 is perpendicular to each of the first direction DR1 and the second direction DR2. In embodiments explaining the display device 10, the third direction DR3 represents a thickness direction (or display direction) of the display device 10.

The display device 10 may have a rectangular shape in which sides in the first direction DR1 is longer than sides in the second direction DR2 in a plan view. In a plan view, the corner of the display device 10 where the long side meets the short side may be right-angled, but the embodiments are not limited thereto, and may have a rounded curved shape. The shape of the display device 10 is not limited to these embodiments, and may have other shapes. For example, the display device 10 may have a shape such as a square, a rectangle having rounded corners (vertexes), a polygon, or a circle in a plan view.

The display surface of the display device 10 may be disposed at a side of the third direction DR3 which is a thickness direction. In the embodiments for explaining the display device 10, unless otherwise stated, "upper" refers to a display direction toward a side in the third direction DR3, likewise the "upper surface" refers to a surface facing a side in the third direction DR3. "Lower" refers to a direction opposite to the display direction toward the other side in the third direction DR3, and the "lower surface" refers to a surface facing the other side in the third direction DR3. Further, the "left", "right", "upper", and "lower" refer to directions when the display panel 10 is viewed in a plan view. For example, the "right side" refers to a side in the first direction DR1, the "left side" refers to the other side in the first direction DR1, the "upper side" refers to a side in the second direction DR2, and the "lower side" refers to the other side in the second direction DR2.

The display device 10 may include a display area DPA and a non-display area NDA. The display area DPA is an area where an image is displayed, and the non-display area NDA is an area where an image is not displayed.

The shape of the display area DPA may follow the shape of the display device 10. For example, the display area DPA may have a planar rectangular shape similar to the overall shape of the display device 10. The display area DPA may occupy the center of the display device 10.

The display area DPA may include multiple pixels PX. The pixels PX may be arranged in a matrix direction. The shape of each of the pixels PX may be rectangular or square in a plan view. In an embodiment, each pixel PX may include multiple light emitting elements made of inorganic particles.

The non-display area NDA may be disposed around the display area DPA. The non-display area NDA may entirely or partially surround the display area DPA. The non-display area NDA may constitute a bezel of the display device 10.

Figure 2:
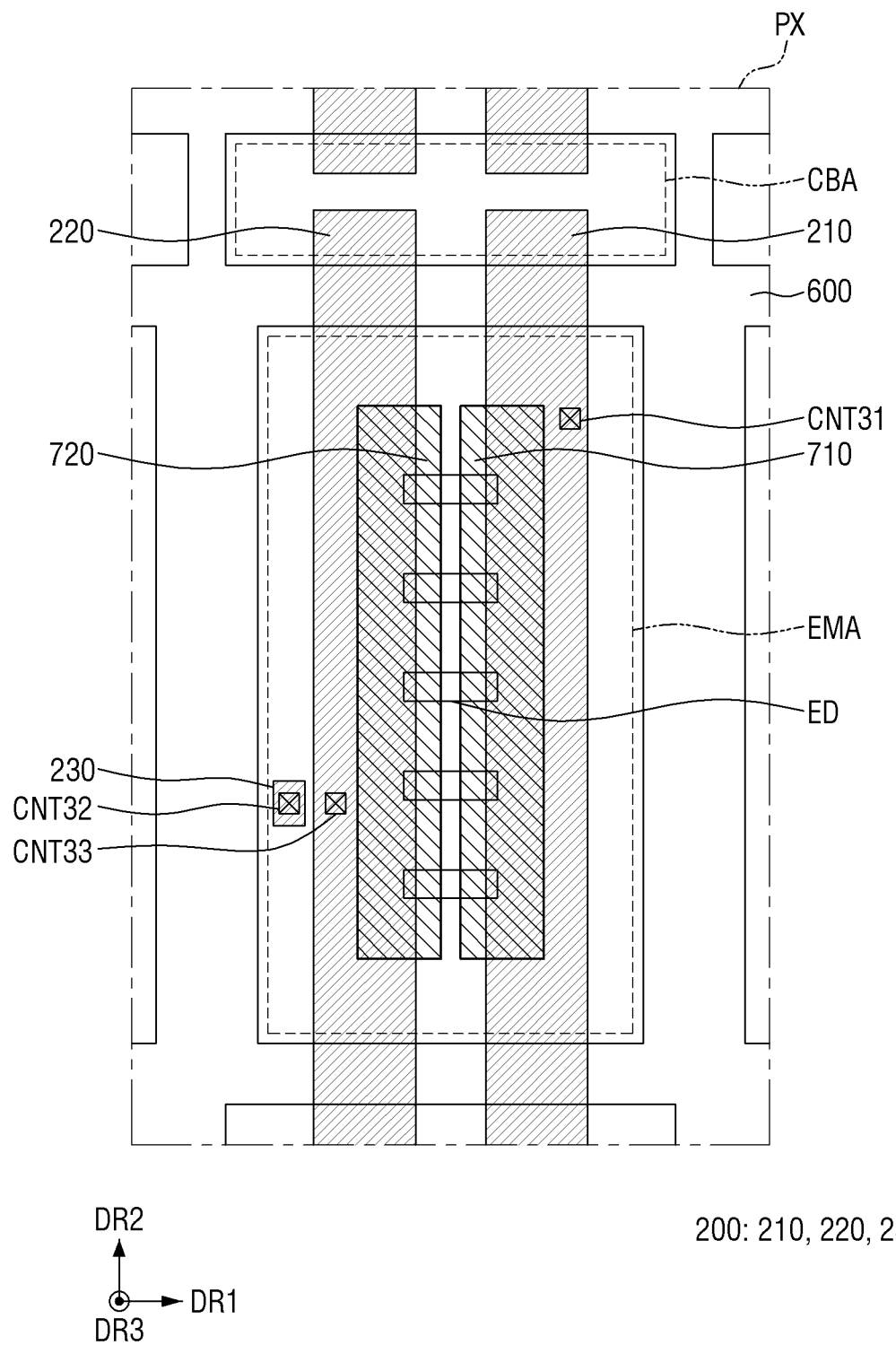
FIG. 2 is a schematic plan view illustrating one pixel of a display device according to an embodiment.

FIG. 2 is a schematic plan view illustrating a pixel of a display device according to an embodiment.

Referring to FIG. 2, each pixel PX of the display device 10 may include a light emission area EMA and a non-light emission area (not shown). The light emission area EMA may be defined as an area through which light emitted from the light emitting element ED is output, and the non-light emission area may be defined as an area in which light emitted from the light emitting element ED does not reach and thus light is not output.

The light emission area EMA may include an area in which the light emitting element ED is disposed and an area adjacent thereto. The light emission area EMA may further include an area in which light emitted from the light emitting element ED is reflected or refracted by other components and the light is output.

Each pixel PX may further include a first area CBA disposed in the non-light emission area. The first area CBA may be disposed at the upper side (or a side in the second direction DR2) of the light emission area EMA in a pixel PX. The first area CBA may be disposed between the light emission areas EMA of the pixel PX neighboring in the second direction DR2.

The first area CBA may be an area in which first and second electrodes 210 and 220 adjacent to each other along the second direction DR2, included in each pixel PX, are separated from each other. The first and second electrodes 210 and 220 arranged for each pixel PX are separated from each other in the first area CBA, and some of the first and second electrodes 210 and 220 disposed for each pixel PX may be arranged in the first area CBA. The light emitting element ED may not be disposed in the first area CBA.

Figure 3:
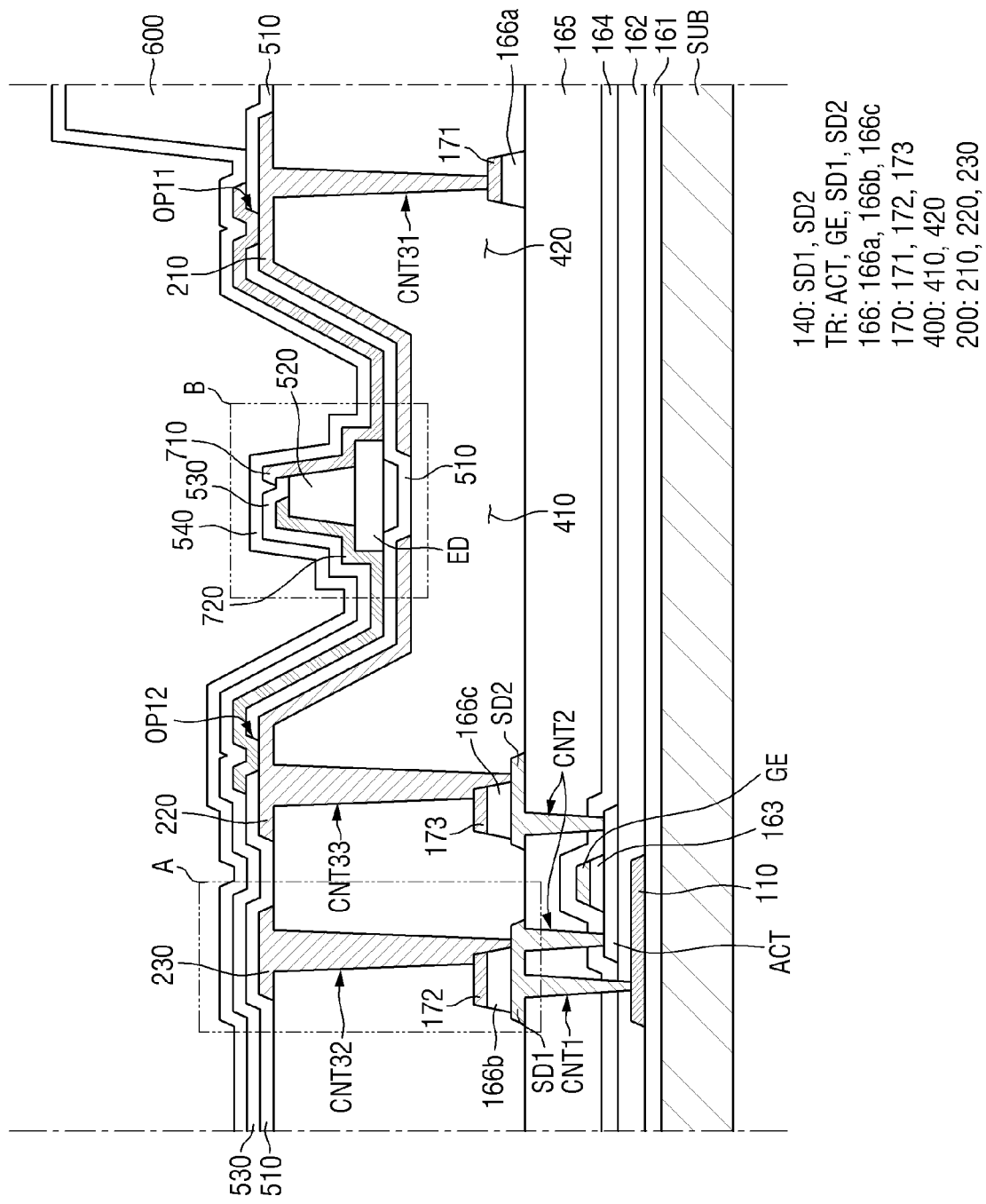
FIG. 3 is a schematic cross-sectional view of a display device according to an embodiment.

FIG. 3 is a cross-sectional view of a display device according to an embodiment.

Referring to FIG. 3, the display device 10 may include a substrate SUB, conductive layers disposed on the substrate SUB, insulating layers, and light emitting elements ED.

The substrate SUB may be an insulating substrate. The substrate SUB may be made of an insulating material such as glass, quartz, or polymer resin. The substrate SUB may be a rigid substrate, but may also be a flexible substrate capable of bending, folding, rolling, and the like.

A barrier layer 161 may be disposed on the substrate SUB. The barrier layer 161 may prevent oxygen and moisture from flowing into a transistor TR.

A lower metal layer 110 may be disposed on the substrate SUB. The lower metal layer 110 may be a light blocking layer serving to protect an active layer (active material layer) ACT of the transistor TR. The lower metal layer 110 may include a light blocking material. For example, the lower metal layer 110 may be formed of an opaque metal material that blocks light transmission.

The lower metal layer 110 has a patterned shape. The lower metal layer 110 may be disposed below to cover at least a channel region of the active material layer ACT of the transistor TR. The lower metal layer 110 may be disposed to cover the entire active material layer ACT of the transistor TR. However, the embodiments are not limited thereto, and the lower metal layer 110 may be omitted.

A buffer layer 162 may be disposed on the lower metal layer 110. The buffer layer 162 may be disposed to cover the entire surface of the substrate SUB on which the lower metal layer 110 is disposed. The buffer layer 162 may protect the transistor TR from moisture penetrating through the substrate SUB which may be vulnerable to moisture permeation.

The buffer layer 162 may be formed of inorganic layers alternately stacked. For example, the buffer layer 162 may be formed as multiple layers in which inorganic layers including at least one of silicon oxide (SiOx), silicon nitride (SiNx), and silicon oxynitride (SiOxNy) are alternately stacked.

The transistor TR may be disposed on the buffer layer 162 and may constitute a pixel circuit for each of multiple pixels. For example, the transistor TR may be a driving transistor or switching transistor of a pixel circuit. Although only one transistor TR of transistors included in the pixel PX of the display device 10 is shown in the drawings, the embodiments are not limited thereto. The pixel PX of the display device 10 may include a larger number of transistors. For example, the display device 10 may include two or three transistors for each pixel PX.

A semiconductor layer may be disposed on the buffer layer 162. The semiconductor layer may include an active layer (active material layer) ACT of the first transistor TR. The active material layer ACT may be disposed to overlap the lower metal layer 110.

The semiconductor layer may include polycrystalline silicon, monocrystalline silicon, an oxide semiconductor, or the like. In an embodiment, in case that the semiconductor layer includes polycrystalline silicon, the polycrystalline silicon may be formed by crystallizing amorphous silicon. In case that the semiconductor layer includes polycrystalline silicon, the active material layer ACT may include multiple doping regions doped with impurities and a channel region between the doping regions. In another embodiment, the semiconductor layer may include an oxide semiconductor. Examples of the oxide semiconductor may include indium-tin oxide (ITO), indium-zinc oxide (IZO), indium-gallium oxide (IGO), indium-Indium-zinc-tin Oxide (IZTO), indium-gallium-zinc oxide (IGZO), indium-gallium-tin oxide (IGTO), and indium-gallium-zinc-tin oxide (IGZTO).

A gate insulating layer 163 may be disposed on the semiconductor layer. The gate insulating layer 163 may function as a gate insulating layer of the transistor TR. The gate insulating layer 163 may be formed in the same pattern as a gate conductive layer including a gate electrode GE, which will be described below. The sidewall of the gate insulating layer 163 may be substantially aligned with the sidewall of the gate conductive layer, but the embodiments are not limited thereto.

The gate insulating layer 163 may be formed as multiple layers in which inorganic layers including at least one inorganic material of silicon oxide (SiOx), silicon nitride (SiNx), and silicon oxynitride (SiOxNy) are alternately stacked.

The gate conductive layer may be disposed on the gate insulating layer 163. The gate conductive layer may include the gate electrode GE of the transistor TR. The gate electrode GE may be disposed to overlap the channel region of the active material layer ACT in the third direction DR3. The sidewall of the gate electrode GE may be substantially aligned with the sidewall of the underlying gate insulating layer 163, but the embodiments are not limited thereto.

The gate conductive layer may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the embodiments are not limited thereto.

A first interlayer insulating layer 164 may be disposed on the gate conductive layer. The first interlayer insulating layer 164 may be disposed to cover the gate electrode GE. The first interlayer insulating layer 164 may include an inorganic insulating material such as silicon oxide (SiOx), silicon nitride (SiNx), or silicon oxynitride (SiOxNy).

A second interlayer insulating layer 165 may be disposed on the first interlayer insulating layer 164. The second interlayer insulating layer 165 may planarize a step formed by the first interlayer insulating layer 164. The second interlayer insulating layer 165 may include an organic insulating material. However, the embodiments are not limited thereto, and the second interlayer insulating layer 165 may be omitted.

A first conductive layer 140 may be disposed on the second interlayer insulating layer 165. The first conductive layer 140 may include a first source/drain electrode SD1 and a second source/drain electrode SD2 of the transistor TR. Although not shown in the drawing, the first conductive layer 140 may further include a data line.

The first and second source/drain electrodes SD1 and SD2 of the transistor TR may be electrically connected to both end regions of the active layer (active material layer) ACT of the transistor TR (for example, each doping region of the active material layer ACT of the transistor TR), respectively, through a contact hole CNT2 penetrating the second interlayer insulating layer 165 and the first interlayer insulating layer 164. Further, the first source/drain electrode SD1 of the transistor TR may be electrically connected to the lower metal layer 110 through another contact hole CNT1 penetrating the second interlayer insulating layer 165, the first interlayer insulating layer 164, and the buffer layer 162.

The first conductive layer 140 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the embodiments are not limited thereto.

A passivation layer 166 may be disposed on the first conductive layer 140. The passivation layer 166 may be provided on the transistor TR, and may function as an interlayer insulating layer between the first conductive layer 140 and the second conductive layer 170 to be described below. The passivation layer 166 may include an inorganic insulating material such as silicon oxide (SiOx), silicon nitride (SiNx), or silicon oxynitride (SiOxNy).

The passivation layer 166 may have a patterned shape. In an embodiment, the passivation layer 166 may be formed in the same pattern as the second conductive layer 170 to be described below. The sidewall of the passivation layer 166 may be substantially aligned with the sidewall of the second conductive layer 170.

The passivation layer 166 may include a first region 166a, a second region 166b, and a third region 166c. Details of the first to third regions 166a, 166b, and 166c of the passivation layer 166 will be described below.

The second conductive layer 170 may be disposed on the passivation layer 166. The second conductive layer 170 may be disposed on the passivation layer 166 to cover the upper surface of the passivation layer 166. The second conductive layer 170 may include a first power line 171, a second power line 172, and a first conductive pattern 173.

A low-potential voltage (or a first power voltage) may be supplied to the first power line 171, and a high-potential voltage (or a second power voltage) may be supplied to the second power line 172. The high-potential voltage supplied to the second power line 172 may be higher than the low-potential voltage supplied to the first power line 171.

The first power line 171 may be electrically connected to the first electrode 210 through a contact hole CNT31 and may supply a low potential voltage (first power voltage) to the first electrode 210. During the process of manufacturing the display device 10, an alignment signal for aligning the light emitting element ED may be applied to the first power line 171.

The second power line 172 may be disposed to overlap the first source/drain electrode SD1 of the transistor TR in the third direction DR3. The second power line 172 may be electrically connected to the first source/drain electrode SD1 of the transistor TR through a connection pattern 230 to be described below.

The first conductive pattern 173 may be disposed to overlap the second source/drain electrode SD2 of the transistor TR in the third direction DR3. The first conductive pattern 173 may be electrically connected to the second source/drain electrode SD2 of the transistor TR through the second electrode 220.

The second conductive layer 170 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the embodiments are not limited thereto.

The first region 166a of the passivation layer 166 may be disposed between the first power line 171 and the second interlayer insulating layer 165. The first region 166a of the passivation layer 166 may be disposed on the upper surface of the second interlayer insulating layer 165 between the first power line 171 and the second interlayer insulating layer 165.

The first region 166a of the passivation layer 166 may be formed in the same pattern as the first power line 171. The sidewall of the first region 166a of the passivation layer 166 may be substantially aligned with the sidewall of the first power line 171.

The second region 166b of the passivation layer 166 may be disposed between the second power line 172 and the first source/drain electrode SD1 of the transistor TR. The second region 166b of the passivation layer 166 may be disposed on the upper surface of the first source/drain electrode SD1 of the transistor TR between the second power line 172 and the first source/drain electrode SD1 of the transistor TR.

The second region 166b of the passivation layer 166 may be formed in the same pattern as the second power line 172. The sidewall of the second region 166b of the passivation layer 166 may be substantially aligned with the sidewall of the second power line 172. The second region 166b of the passivation layer 166 and the second power line 172 may be disposed so as to expose at least a part of the first source/drain electrode SD1 of the transistor TR in the third direction DR3.

The third region 166c of the passivation layer 166 may be disposed between the first conductive pattern 173 and the second source/drain electrode SD2 of the transistor TR. The third region 166c of the passivation layer 166 may be disposed on the upper surface of the second source/drain electrode SD2 of the transistor TR between the first conductive pattern 173 and the second source/drain electrode SD2 of the transistor TR.

The third region 166c of the passivation layer 166 may be formed in the same pattern as the first conductive pattern 173. The sidewall of the third region 166c of the passivation layer 166 may be substantially aligned with the sidewall of the first conductive pattern 173. The third region 166c of the passivation layer 166 and the first conductive pattern 173 may be disposed so as to expose at least a part of the second source/drain electrode SD2 of the transistor TR in the third direction DR3.

A via layer 400 is disposed on the second conductive layer 170. The via layer 400 may be disposed on the passivation layer 166 on which the second conductive layer 170 is disposed. The via layer 400 may be disposed to cover the upper surface and sidewall of the second conductive layer 170 and to cover the sidewall of the passivation layer 166 aligned parallel to the sidewall of the second conductive layer 170. The via layer 400 may cover the outer surfaces of the second conductive layer 170 and the passivation layer 166. The via layer 400 may include an organic insulating material. The via layer 400 may further include a photosensitive material, but the embodiments are not limited thereto. In an embodiment, the via layer 400 may include an organic material such as polyimide (PI).

The via layer 400 generally has a flattened surface, but may have a different height for each region. The via layer 400 may include a step. The via layer 400 may have a stepped structure having a different height for each region. The via layer 400 may include a first region 410 having a first height and a second region 420 having a second height higher than the first height. The height of the via layer 400 may be measured from a reference surface such as a surface of the substrate SUB. The via layer 400 may have a substantially flat surface within each region regardless of the shape or presence of the underlying pattern. At the boundary of each region, the via layer 400 may have a stepped structure.

The first region 410 of the via layer 400 may be disposed in the light emission area EMA in the display area DPA. The first region 410 of the via layer 400 serves to perform a surface planarization function, and may be provided with multiple light emitting elements ED. The second region 420 of the via layer 400 may partition a space in which light emitting elements ED are arranged.

The via layer 400 may include an inclined side surface between the first region 410 and second region 420 of the via layer 400. Since the via layer 400 includes an inclined side surface, the traveling direction of light emitted from the light emitting element ED and traveling toward the side surface of the via layer 400 may be changed to an upward direction (for example, a display direction). The via layer 400 may provide a space in which multiple light emitting elements ED are arranged, and at the same time serve as a reflective partition wall that changes the traveling direction of light emitted from the light emitting element ED to be described below to a display direction.

Although it is shown in the drawings that the inclined side surface disposed between the first region 410 and second region 420 of the via layer 400 is inclined in a linear shape, the embodiments are not limited thereto. For example, the side surface of the via layer 400 may have a curved semi-circular or semi-elliptical shape.

The via layer 400 may include contact holes CNT31, CNT32, and CNT33 penetrating the via layer 400. The contact holes CNT31, CNT32, and CNT33 may expose a part of the first conductive layer 140 and/or a part of the second conductive layer 170.

The via layer 400 may include a first contact hole CNT31 exposing a part of the first power line 171, a second contact hole CNT32 exposing parts of the second power line 172, the second region 166b of the passivation layer 166, and the first source/drain electrode SD1 of the transistor TR, and a third contact hole CNT33 exposing parts of the first conductive pattern 173, the third region 166c of the passivation layer 166, and the second source/drain electrode SD2 of the transistor TR.

The first contact hole CNT31 may expose a part of the upper surface of the first power line 171 in the third direction DR3. The sidewall of the via layer 400, constituting the first contact hole CNT31, may overlap the first power line 171 and the first region 166a of the passivation layer 166 disposed under the first power line 171 in the third direction DR3.

The second contact hole CNT32 may overlap the second power line 172 and the first source/drain electrodes SD1 of the transistor TR and in the third direction DR3 in addition to the boundary region between the second power line 172 and the first source/drain electrode SD1 of the transistor TR in a plan view.

The sidewall of the second power line 172 and the second region 166b of the passivation layer 166 disposed under the second power line 172 may constitute the second contact hole CNT32 together with the sidewall of the via layer 400.

The third contact hole CNT33 may overlap the first conductive pattern 173 and the second source/drain electrode SD2 of the transistor TR in the third direction DR3 in addition to the boundary region between the first conductive pattern 173 and the second source/drain electrode SD2 of the transistor TR in a plan view. The sidewall of the first conductive pattern 173 and the third region 166c of the passivation layer 166 disposed under the first conductive pattern 173 may constitute the third contact hole CNT33 together with the sidewall of the via layer 400.

Referring to FIGS. 2 and 3, a third conductive layer 200 may be disposed on the via layer 400. The third conductive layer 200 may include a first electrode 210, a second electrode 220, and a connection pattern 230, which are spaced apart from each other.

The first electrode 210 may have a shape extending in the second direction DR2 in a plan view. The first electrode 210 may be disposed to traverse the light emission area EMA. The first electrode 210 may extend in the second direction DR2 in a plan view so as to overlap a part of a first bank 600 to be described below.

The first electrode 210 may be disposed in the first region 410 and second region 420 of the via layer 400. The first electrode 210 may be disposed to cover not only the upper surfaces of the first region 410 and second region 420 of the via layer 400 but also the inclined side surface of the via layer 400 connecting them.

The first electrode 210 may be electrically connected to the second conductive layer 170 through the first contact hole CNT31 penetrating the via layer 400 (the second region 420 of the via layer 400).

The first electrode 210 may be electrically connected to the first power line 171 through the first contact hole CNT31 penetrating the second region 420 of the via layer 400. As described above, the first contact hole CNT31 may expose a part of the upper surface of the first power line 171, and the first electrode 210 may be connected to the upper surface of the first power line 171 through the first contact hole CNT31.

The second electrode 220 may be disposed to be spaced apart from the first electrode 210 in the first direction DR1. The second electrode 220 may have a shape extending in the second direction DR2 in a plan view. The second electrode 220 may be disposed to traverse the light emission area EMA. The second electrode 220 may extend in the second direction DR2 in a plan view so as to overlap a part of the first bank 600.

The second electrode 220 may be spaced apart from the first electrode 210, and may be disposed in the first region 410 and second region 420 of the via layer 400. The second electrode 220 may be disposed to cover not only the upper surfaces of the first region 410 and second region 420 of the via layer 400 but also the inclined side surface of the via layer 400 connecting them.

The second electrode 220 may be electrically connected to the first conductive layer 140 and the second conductive layer 170 through the third contact hole CNT33 penetrating the via layer 400 (the second region 420 of the via layer 400).

The second electrode 220 may be electrically connected to the first conductive pattern 173 and the second source/drain electrode SD2 of the transistor TR through the third contact hole CNT33 penetrating the second region 420 of the via layer 400. As described above, the third contact hole CNT33 may expose parts of the upper surface and sidewall of the first conductive pattern 173 and a part of the upper surface of the second source/drain electrode SD2 of the transistor TR, and the second electrode 220 may be connected to upper surface of the first conductive pattern 173 and the upper surface of the second source/drain electrode SD2 of the transistor TR through the third contact hole CNT33, respectively. The second electrode 220 filling the inside of the third contact hole CNT33 may contact the upper surface and sidewall of the first conductive pattern 173, the sidewall of the third region 166c of the passivation layer 166, and the upper surface of the second source/drain electrode SD2.

The first electrode 210 and the second electrode 220 may be disposed on the first region 410 of the via layer 400 so as to be spaced apart from each other.

The first and second electrodes 210 and 220 may be electrically connected to the light emitting elements ED, respectively, and a voltage may be applied to the first and second electrodes 210 and 220 such that the light emitting elements ED emit light. For example, the first and second electrodes 210 and 220 may be electrically connected to the light emitting element ED disposed on the first region 410 of the via layer 400 through contact electrodes 710 and 720 to be described below, and electrical signals applied to the first and second electrodes 210 and 220 may be transmitted to the light emitting element ED through the contact electrodes 710 and 720.

The connection pattern 230 may be disposed on the second region 420 of the via layer 400. The connection pattern 230 is disposed on the second region 420 of the via layer 400, and may be spaced apart from the first electrode 210 and the second electrode 220.

The connection pattern 230 may electrically connect the first conductive layer 140 and the second conductive layer 170 to each other through the second contact hole CNT32. The connection pattern 230 may be electrically connected to the first conductive layer 140 and the second conductive layer 170 through the second contact hole CNT32 penetrating the via layer 400 (the second region 420 of the via layer 400).

The connection pattern 230 may electrically connect the first source/drain electrode SD1 of the transistor TR of the first conductive layer 140 and the second power line 172 of the second conductive layer 170 to each other through the second contact hole CNT32 penetrating the second region 420 of the via layer 400.

As described above, the second contact hole CNT32 may expose parts of the upper surface and sidewall of the second power line 172 and a part of the upper surface of the first source/drain electrode SD1 of the transistor TR, and the connection pattern 230 may be connected to the second power line 172 and the upper surface of the first source/drain electrode SD1 of the transistor TR through the second contact hole CNT32, respectively. The connection pattern 230 filling the inside of the second contact hole CNT32 may contact the upper surface and sidewall of the second power line 172, the sidewall of the second region 166b of the passivation layer 166, and the upper surface of the first source/drain electrode SD1 of the transistor TR.

The third conductive layer 200 may include a conductive material having high reflectance. For example, the third conductive layer 200 may include a metal such as silver (Ag), copper (Cu), or aluminum (Al), or may include an alloy containing aluminum (Al), nickel (Ni), or lanthanum (La), as the conductive material having high reflectance. Since the third conductive layer 200 may include a conductive material having high reflectance, the third conductive layer 200 may reflect light emitted from the light emitting element ED and traveling toward the first electrode 210 and second electrode 220 disposed on the inclined side surface of the via layer 400, located between the first region 410 and second region 420 of the via layer 400, in a display direction (for example, third direction DR3).

However, the embodiments are not limited thereto, and the third conductive layer 200 may further include a transparent conductive material. For example, the third conductive layer 200 may include a material such as ITO, IZO, or ITZO. In some embodiments, the third conductive layer 200 may have a structure in which one or more transparent conductive material layers and one or more metal layers having high reflectance are stacked, or may be formed as one layer including these layers. For example, third conductive layer 200 may have a stacked structure of ITO/Ag/ITO/, ITO/Ag/IZO, or ITO/Ag/ITZO/IZO.

A first insulating layer 510 may be disposed on the third conductive layer 200. The first insulating layer 510 may protect the first electrode 210, second electrode 220, and connection pattern 230 of the third conductive layer 200 and insulate them from each other. The third conductive layer 200 may be disposed on the first electrode 210 and the second electrode 220 in addition to the region between the first electrode 210 and the second electrode 220 to insulate them from each other. Further, the first insulating layer 510 may completely cover the upper portion of the connection pattern 230 to insulate the connection pattern 230 from the first and second electrodes 210 and 220. The first insulating layer 510 may prevent the light emitting element ED disposed on the first insulating layer 510 from being damaged by direct contact with other members.

In an embodiment, first and second openings OP11 and OP12 may be formed in the first insulating layer 510 to respectively expose parts of the first electrode 210 and the second electrode 220. The first opening OP11 may be formed in the second region 420 of the via layer 400 and a region overlapping the first electrode 210 in the third direction DR3. The second opening OP12 may be formed in the second region 420 of the via layer 400 and a region overlapping the second electrode 220 in the third direction DR3. The first contact electrode 710 to be described below may contact the first electrode 210 through the first opening OP11 penetrating the first insulating layer 510, and the second contact electrode 720 to be described below may contact the second electrode 220 through the second opening OP12 penetrating the first insulating layer 510.

A first bank 600 may be disposed on the first insulating layer 510. The first bank 600 may be disposed on the upper surface of the second region 420 of the via layer 400 on which the first insulating layer 510 is disposed. The first bank 600 may be disposed in a lattice pattern including portions extending in the first direction DR1 and the second direction DR2 in a plan view. The first bank 600 may perform a function of preventing ink including the light emitting elements ED from overflowing to the adjacent pixels PX in the inkjet printing process for aligning the light emitting elements ED during the process of manufacturing the display device 10.

The light emitting element ED may be disposed on the first region 410 of the via layer 400. The light emitting element ED may be disposed on the first insulating layer 510 disposed on the first region 410 of the via layer 400.

The light emitting element ED may be disposed on the first insulating layer 510 such that both ends of the light emitting element ED in the extension direction thereof are respectively placed on the first electrode 210 and the second electrode 220. The direction in which the light emitting element ED extends may be substantially perpendicular to the direction in which the electrodes 210 and 220 extend. However, the embodiments are not limited thereto, and some of the light emitting elements ED may arranged such that the direction in which the light emitting element ED extends is substantially perpendicular to the direction in which the first and second electrodes 210 and 220 extend, and others of the light emitting elements ED may arranged such that the direction in which the light emitting element ED extends is oblique to the direction in which the first and second electrodes 210 and 220 extend.

A second insulating layer 520 may be partially disposed on the light emitting element ED. The second insulating layer 520 may be disposed to partially surround the outer surface of the light emitting element ED, but may be disposed so as not to cover both ends of the light emitting element ED.

A partial region of the second insulating layer 520 disposed on the light emitting element ED may be disposed on the first insulating layer 510 to extend in the second direction DR2 in a plan view, thereby forming a linear or island-shaped pattern within each pixel PX. The second insulating layer 520 may protect the light emitting element ED, and may fix the light emitting element ED in the process of manufacturing the display element 10.

The first contact electrode 710 may be disposed on the first electrode 210. The first contact electrode 710 may have a shape extending in one direction. The first contact electrode 710 may have a shape extending in the second direction DR2. The first contact electrode 710 may form a stripe pattern in the light emission area EMA of each pixel PX.

The first contact electrode 710 may contact the first electrode 210 and one end of the light emitting element ED. The first contact electrode 710 is disposed on the first electrode 210, so that a part of the first contact electrode 710 may contact a surface of the first electrode 210 exposed by the first opening OP11 formed in the first insulating layer 510, and the other part thereof may contact one end of the light emitting element ED. The first contact electrode 710 may electrically connect the light emitting element ED and the first electrode 210 by contacting an end of the light emitting element ED and the first electrode 210, respectively. The first contact electrode 710 may extend from an end of the light emitting element ED toward the second insulating layer 520 to be disposed even on the side surface of the second insulating layer 520. Further, the first contact electrode 710 may extend toward a third insulating layer 530, which will be described below, to be disposed even on a part of the third insulating layer 530.

The second contact electrode 720 may be disposed on the second electrode 220. The second contact electrode 720 may have a shape extending in one direction. The second contact electrode 720 may have a shape extending in the second direction DR2. The second contact electrode 720 may form a stripe pattern in the light emission area EMA of each pixel PX. The second contact electrode 720 may be disposed to face the first contact electrode 710 and spaced apart from the first contact electrode 710 in the first direction DR1.

The second contact electrode 720 may contact the second electrode 220 and the other end of the light emitting element ED. The second contact electrode 720 is disposed on the second electrode 220, so that a part of the second contact electrode 720 may contact a surface of the second electrode 220 exposed by the second opening OP12 formed in the first insulating layer 510, and the other part of the second contact electrode 720 may contact the other end of the light emitting element ED (another end of the light emitting element ED contacted by the first contact electrode 710). The second contact electrode 720 may electrically connect the light emitting element ED and the second electrode 220 by contacting the end of the light emitting element ED and the second electrode 220, respectively. The second contact electrode 720 may extend from the other end of the light emitting element ED toward the second insulating layer 520 to be disposed on the upper surface and side surface of the second insulating layer 520.

Each of the first and second contact electrodes 710 and 720 may include a conductive material. For example, each of the first and second contact electrodes 710 and 720 may include ITO, IZO, ITZO, or aluminum (Al). For example, each of the first and second contact electrodes 710 and 720 may include a transparent conductive material, but the material thereof is not limited thereto.

A third insulating layer 530 may be disposed on the second contact electrode 720. The third insulating layer 530 may be disposed to cover the second contact electrode 720. An end surface of the third insulating layer 530 and an end surface of the second insulating layer 520, which are disposed on a side where the first electrode 210 is disposed, may be aligned parallel to each other.

The third insulating layer 530 may electrically insulate the first contact electrode 710 and the second contact electrode 720 from each other. The third insulating layer 530 is disposed to cover the second contact electrode 720, but may not be disposed on one end of the light emitting element ED such that the light emitting element ED contacts the first contact electrode 710.

The first contact electrode 710 and the second contact electrode 720 may be disposed on different layers from each other. A part of the first contact electrode 710 is disposed directly on the third insulating layer 530 disposed on the light emitting element ED, and a part of the second contact electrode 720 is directly disposed on the second insulating layer 520, so that the third insulating layer 530 may be interposed between the first contact electrode 710 and the second contact electrode 720.

A fourth insulating layer 540 may be disposed to entirely cover the substrate SUB. The fourth insulating layer 540 may protect the members disposed on the substrate SUB from the external environment.

Figure 4:
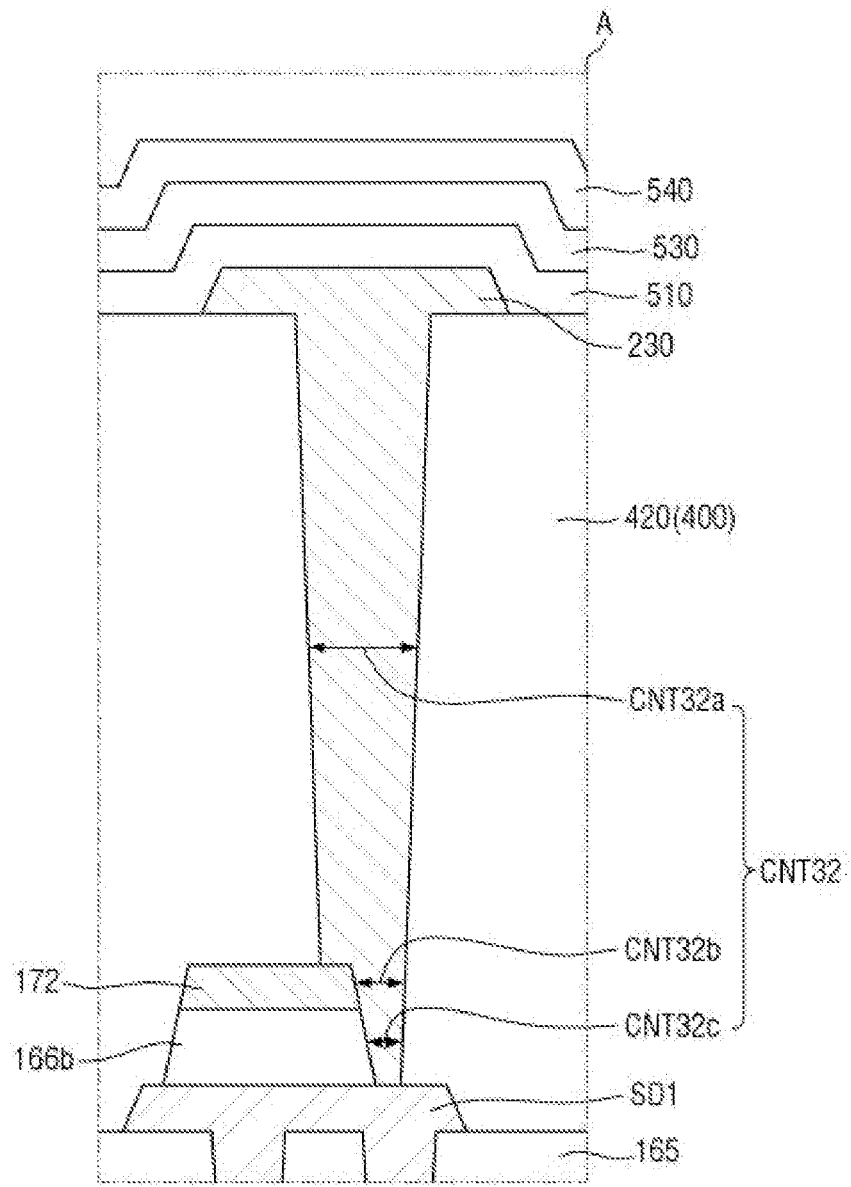
FIG. 4 is an enlarged schematic cross-sectional view illustrating an example of the area A of FIG. 3.

FIG. 4 is an enlarged cross-sectional view illustrating an example of the area A of FIG. 3.

Hereinafter, a relationship among the first to third conductive layers 140, 170, and 200, the passivation layer 166, and the via layer 400 will be described in detail.

As described above, as described above, the passivation layer 166 and the second conductive layer 170 formed in the same pattern may be disposed on the first conductive layer 140, and the via layer 400 may be disposed on the second conductive layer 170. The third conductive layer 200 may be disposed on the via layer 400. At least a part of the third conductive layer 200 may electrically connect the first conductive layer 140 and the second conductive layer 170 through a contact hole penetrating the via layer 400. The contact holes CNT32 and CNT33 penetrating the second region 420 of the via layer 400 may expose a part of the upper surface of the first conductive layer 140, a part of a sidewall (side surface) and upper surface of the second conductive layer 170, and a sidewall of the passivation layer 166 aligned in parallel with a sidewall of the second conductive layer 170 in the third direction DR3.

A part of the third conductive layer 200 may contact a part of the upper surface of the first conductive layer 140 and a part of the sidewall and upper surface of the second conductive layer 170, thereby electrically connecting the first conductive layer 140 and the second conductive layer 170 to each other.

The passivation layer 166 may be interposed between the first conductive layer 140 and the second conductive layer 170. As the passivation layer 166 is formed in the same pattern as the second conductive layer 170, in the process of forming a contact hole exposing the upper surface and a side wall of the second conductive layer 170, a process of etching the passivation layer 166 may be omitted, and thus a side contact process between the first conductive layer 140 and the second conductive layer 170 may be facilitated.

Hereinafter, the relationship among the first to third conductive layers 140, 170, and 200, the passivation layer 166, and the via layer 400 will be described based on the second power line 172 and the first source/drain electrode SD1 of the transistor TR, disposed under the connection pattern 230, with reference to FIGS. 3 and 4.

The connection pattern 230 included in the third conductive layer 200 may electrically connect the first conductive layer 140 and the second conductive layer 170 through the second contact hole CNT32 penetrating through the via layer 400. The connection pattern 230 may be disposed on the second region 420 of the via layer 400 to electrically connect the second power line 172 included in the second conductive layer 170 and the first source/drain electrode SD1 of the transistor TR included in the first conductive layer 140 through the second contact hole CNT32 penetrating the second region 420 of the via layer 400.

The inner wall of the second contact hole CNT32 may be disposed to overlap the second power line 172, the second region 166b of the passivation layer 166, and the first source/drain electrode SD1 of the transistor TR. The second contact hole CNT32 may expose a part of the upper surface of the first source/drain electrode SD1 of the transistor TR included in the first conductive layer 140, a side wall of the second region 166b of the passivation layer 166, and a part of a sidewall and upper surface of the second power line 172 of the second conductive layer 170. A part of the upper surface of the first source/drain electrode SD1 of the transistor TR exposed by the second contact hole CNT32 may overlap a region exposed by the second power line 172 and the second region 166b of the passivation layer 166 in the third direction DR3. The connection pattern 230 may contact a sidewall of the second power line 172, a part of the upper surface of the second power line 172, and a part of the upper surface of the first source/drain electrode SD1 of the transistor TR, which are exposed in the third direction DR3, through the second contact hole CNT32.

The second contact hole CNT32 may include a first portion CNT32a, a second portion CNT32b, and a third portion CNT32c according to the sidewalls of members forming the second contact hole CNT32. The first portion CNT32a of the second contact hole CNT32 is formed by the sidewall of the via layer 400, the second part CNT32b of the second contact hole CNT32 may be formed by the sidewall (or side surface) of the second power line 172 and the sidewall of the via layer 400, and the third portion CNT32c of the second contact hole CNT32 may be formed by the sidewall of the second region 166b of the passivation layer 166 and the sidewall of the via layer 400. The first to third portions CNT32a, CNT32b, and CNT32c of the second contact hole CNT32 may be integrated with each other to form a single hole.

The width of the first portion CNT32a of the second contact hole CNT32 may be greater than the widths of the second and third portions CNT32b and CNT32c of the second contact hole CNT32. The width of the second portion CNT32b of the second contact hole CNT32 may be greater than the width of the third portion CNT32c of the second contact hole CNT32. The width of the second contact hole CNT32 may decrease toward an lower direction (the direction opposite to the third direction DR3), but may have a step shape at the second portion CNT32b thereof.

The third portion CNT32c of the second contact hole CNT32, formed by the sidewall (or side surface) of the second region 166b of the passivation layer 166 and the sidewall of the via layer 400, may not overlap the second conductive layer 170 in the third direction DR3. The third portion CNT32c of the second contact hole CNT32 may not overlap the second power line 172 in the third direction DR3. The third portion CNT32c of the second contact hole CNT32 may not be interposed between the second power line 172 and the first source/drain electrode SD1 of the transistor TR. In the embodiment, the passivation layer 166 interposed between the first conductive layer 140 and the second conductive layer 170 may not include a contact hole penetrating the passivation layer 166.

The first insulating layer 510 may be disposed on the connection pattern 230 to completely cover the connection pattern 230. Since the connection pattern 230 is completely covered by the first insulating layer 510, the connection pattern 230 may be electrically insulated from the first electrode 210 and the second electrode 220.

Figure 5:
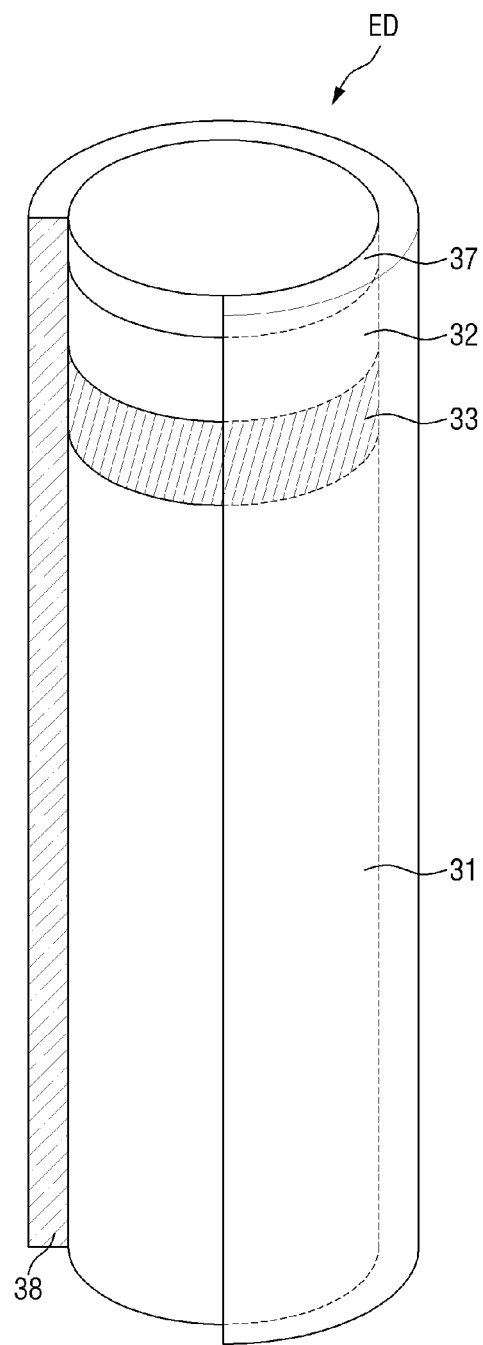
FIG. 5 is a schematic view of a light emitting element according to an embodiment.

FIG. 5 is a schematic view of a light emitting element according to an embodiment.

Referring to FIG. 5, the light emitting element ED is a particulate element, and may have a rod shape or a cylindrical shape having an aspect ratio. The length of the light emitting element ED is larger than the diameter of the light emitting element ED, and the aspect ratio thereof may be 1.2:1 to 100:1, but is not limited thereto.

The light emitting element ED may have a size of a nanometer scale (about 1 nm or more to less than about 1 μm) to a micrometer scale (about 1 μm or more to less than about 1 mm). In an embodiment, both diameter and length of the light emitting element ED may have a size of a nanometer scale, or may have a size of a micrometer scale. In some embodiments, the diameter of the light emitting element ED may have a size of a nanometer scale, while the length of the light emitting element ED may have a size of a micrometer scale. In some embodiments, some of the light emitting elements ED may have a size of a nanometer scale in diameter and/or length, while others of the light emitting elements ED may have a size of a micrometer scale in diameter and/or length.

In an embodiment, the light emitting element ED may be an inorganic light emitting diode. The inorganic light emitting diode may include multiple semiconductor layers. For example, the inorganic light emitting diode may include a first conductive (for example, n-type) semiconductor layer, a second conductive (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons having reached the active semiconductor layer may be combined with each other to emit light.

In an embodiment, the above-described semiconductor layers may be sequentially stacked along the length direction of the light emitting element ED. As shown in FIG. 5, the light emitting element ED may include a first semiconductor layer 31, an element active layer 33, and a second semiconductor layer 32, which are sequentially stacked in the length direction. The first semiconductor layer 31, the element active layer 33, and the second semiconductor layer 32 may be the above-described first conductive semiconductor layer, active semiconductor layer, and second conductive semiconductor layer, respectively.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be disposed to be spaced apart from the first semiconductor layer 31 with the element active layer 33 interposed therebetween. The second semiconductor layer 32 may be doped with a second conductive dopant such as Mg, Zn, Ca, Se, or Ba. In an embodiment, the second semiconductor layer 32 may be p-GaN doped with p-type Mg.

The element active layer 33 may include a material having a single or multiple quantum well structure. As described above, the element active layer 33 may emit light by combination of an electron-hole pair according to an electric signal applied through the first semiconductor layer 31 and the second semiconductor layer 32.

In some embodiments, the element active layer 33 may have a structure in which semiconductor materials having high band gap energy and semiconductor materials having low band gap energy are alternately stacked with each other, and may include other Group 3 to Group 5 semiconductor materials depending on the wavelength band of emitted light.

Light emitted from the element active layer 33 may be emitted not only to the outer surface of the light emitting element ED in the longitudinal direction, but also to both side surfaces. The direction of light emitted from the element active layer 33 is not limited to one direction.

The light emitting element ED may further include an element electrode layer 37 disposed on the second semiconductor layer 32. The element electrode layer 37 may contact the second semiconductor layer 32. The element electrode layer 37 may be an ohmic contact electrode, but is not limited thereto, and may be a Schottky contact electrode.

When the ends of the light emitting element ED is electrically connected to the contact electrodes 710 and 720 so as to apply electric signals to the first and second semiconductor layers 31 and 32, the element electrode layer 37 may be disposed between the second semiconductor layer 32 and the contact electrodes 710 and 720 to reduce resistance. The element electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The element electrode layer 37 may include a semiconductor material doped with an n-type or p-type dopant.

The light emitting element ED may further include an element insulating layer 38 surrounding the outer peripheral surfaces of the first semiconductor layer 31, the second semiconductor layer 32, the element active layer 33 and/or the element electrode layer 37. The element insulating layer 38 may be disposed to surround at least an outer surface of the element active layer 33 and may extend in one direction in which the light emitting element ED extends. The element insulating layer 38 may perform a function of protecting the members. The element insulating layer 38 may be comprised of material having insulating properties, and may prevent an electric short that may occur when the element active layer 33 is in direct contact with an electrode through which an electric signal is transmitted to the light emitting element ED. Further, since the element insulating layer 38 protects the outer peripheral surfaces of the first and second semiconductor layers 31 and 32 and the element active layer 33, it is possible to prevent a decrease in light emission efficiency.

Figure 6:
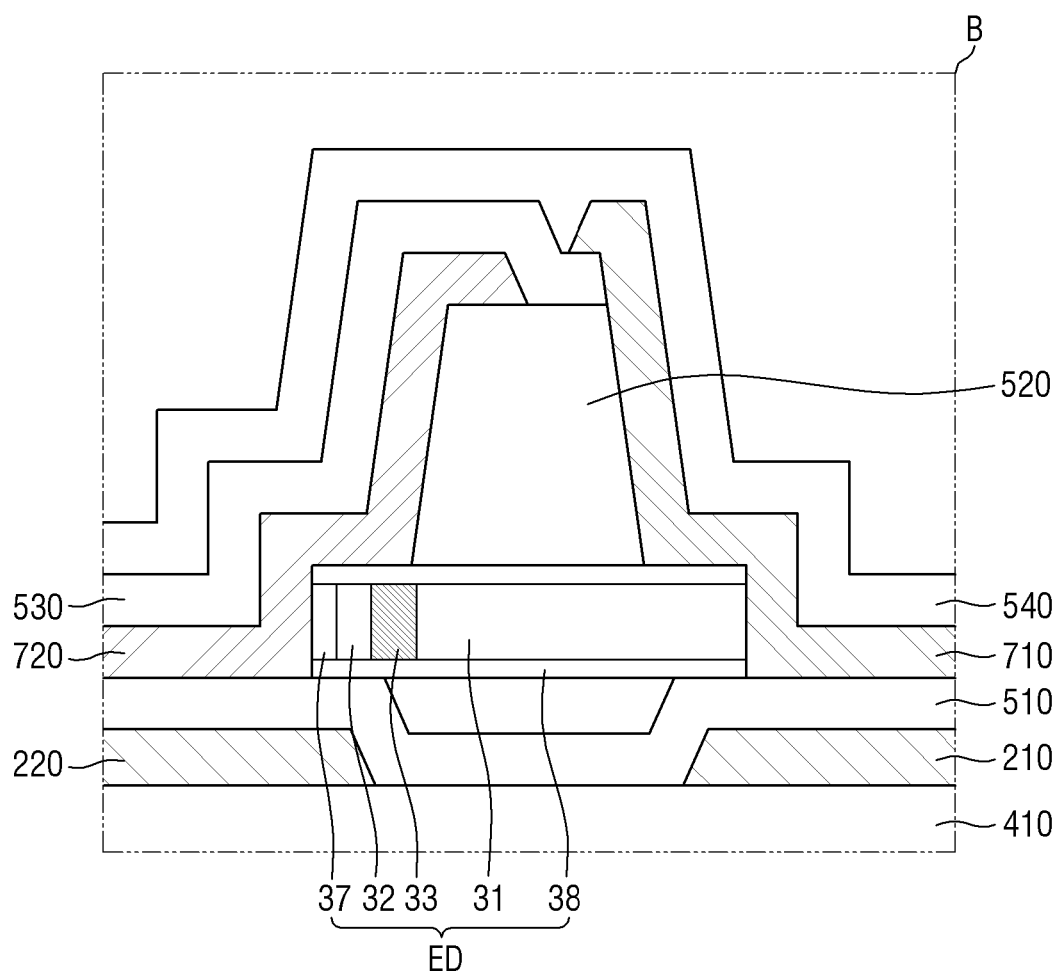
FIG. 6 is an enlarged schematic cross-sectional view illustrating an example of the area B of FIG. 3.

FIG. 6 is an enlarged cross-sectional view illustrating an example of the area B of FIG. 3.

Hereinafter, a contact relationship between the ends of the light emitting element ED and the first and second contact electrodes 710 and 720 will be described with reference to FIG. 6.

As described above, the light emitting element ED may include semiconductor layers 31 and 32 doped with different conductivity types. The light emitting element ED may include the semiconductor layers 31 and 32, and may be aligned such that the ends of the light emitting element ED face a direction according to the direction of an electric field generated on the first and second electrodes 210 and 220 (the ends of the light emitting element are aligned to the electric field generated on the first and second electrodes 210 and 220). The light emitting element ED may have a shape extending in a direction, and each of the ends of the light emitting element ED in the extending direction may each be disposed on the first electrode 210 and the second electrode 220, respectively.

The light emitting element ED may be disposed such that it extends in a direction parallel to the substrate SUB, and the semiconductor layers included in the light emitting element ED may be sequentially arranged along a direction parallel to the upper surface of the substrate SUB. In the light emitting element ED, the first semiconductor layer 31, the element active layer 33, the second semiconductor layer 32, and the element electrode layer 37 may be disposed sequentially in a horizontal direction when a cross-section of the substrate SUB is taken. The light emitting element ED may be aligned such that one end of the light emitting element ED at which the first semiconductor layer 31 is located is disposed on the first electrode 210 and another end of the light emitting element ED at which the second semiconductor layer 32 is located is disposed on the second electrode 220. However, the embodiments are not limited thereto, and in some cases, the light emitting element ED may be aligned such that the end of the light emitting element ED where the first semiconductor layer 31 is located is placed on the second electrode 220 and the other end of the light emitting element ED where the second semiconductor layer 32 is located is disposed on the first electrode 210.

Each of the ends of the light emitting element ED, exposed by the second insulating layer 520, may contact the first contact electrode 710 and the second contact electrode 720, respectively.

The first contact electrode 710 may contact an end of the light emitting element ED. The first contact electrode 710 may contact the first semiconductor layer 31 placed at one end of the light emitting element ED.

The second contact electrode 720 may contact another end of the light emitting element ED. The second contact electrode 720 may contact the element electrode layer 37 disposed at the other end of the light emitting element ED. The second contact electrode 720 may be electrically connected to the second semiconductor layer 32 through the element electrode layer 37 of the light emitting element ED.

An end of the light emitting element ED, where the first semiconductor layer 31 is located, may be electrically connected to the first electrode 210 through the first contact electrode 710, and the other end of the light emitting element ED, where the second semiconductor layer 32 is located, may be electrically connected to the second electrode 220 through the second contact electrode 720. Each of the ends of the light emitting element ED are in contact with the first and second contact electrodes 710 and 720, respectively, so that the light emitting element ED may receive electric signals from the first and second electrodes 210 and 220, and light may be emitted from the element active layer 33 of the light emitting element ED according to the electric signals.

Figure 7:
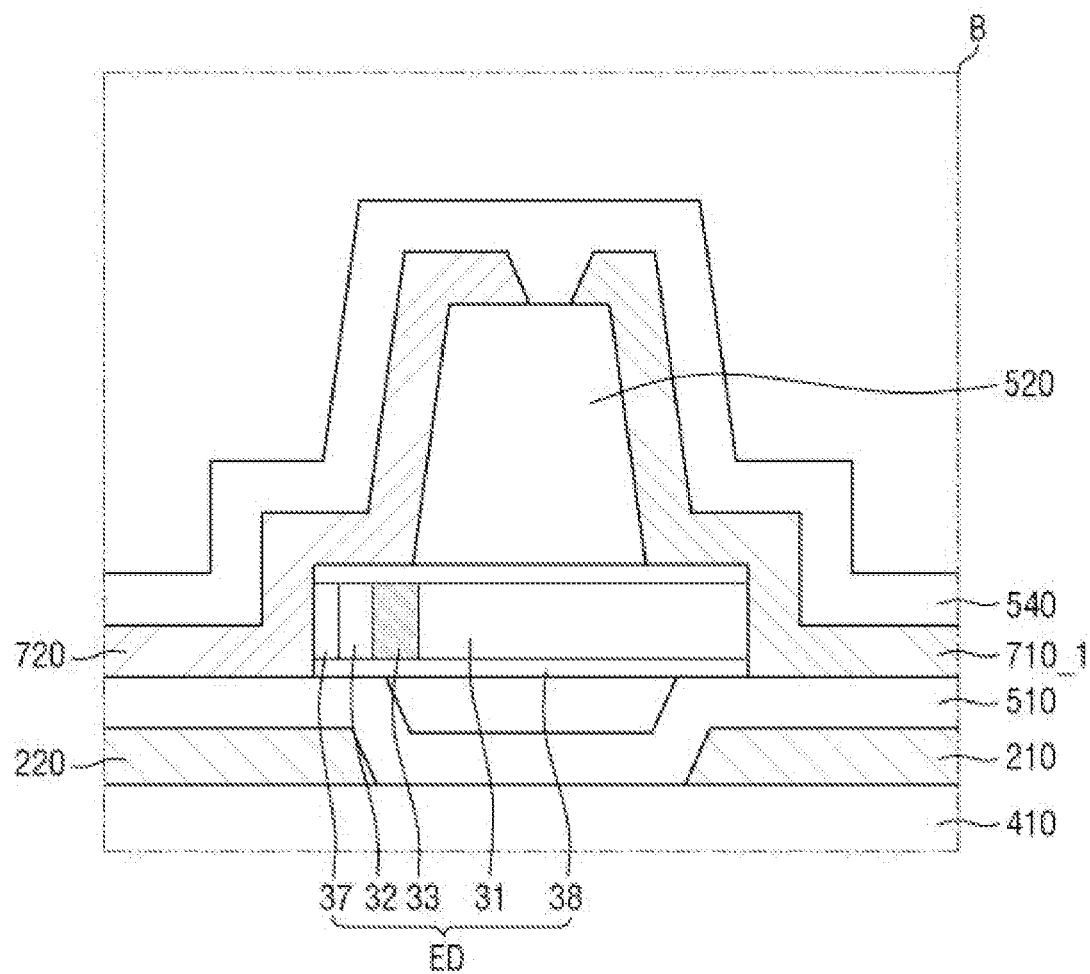
FIG. 7 is an enlarged schematic cross-sectional view illustrating another example of the area B of FIG. 3.

FIG. 7 is an enlarged cross-sectional view illustrating another example of the area B of FIG. 3.

Referring to FIG. 7, the embodiment is different from the embodiment of FIG. 6 in that the third insulating layer is omitted.

The first contact electrode 710 and the second contact electrode 720 may be directly disposed on the second insulating layer 520. The first contact electrode 710 and the second contact electrode 720 may be spaced apart from each other on the second insulating layer 520 to expose a part of the second insulating layer 520. The second insulating layer 520 exposed by the first contact electrode 710 and the second contact electrode 720 may contact the fourth insulating layer 540 in the exposed area.

In the embodiment, in the display device 10, even if the third insulating layer 530 is omitted, the second insulating layer 520 may include an organic insulating material to fix the light emitting element ED. Further, the first contact electrode 710 and the second contact electrode 720 may be patterned by a single mask process to be formed simultaneously. Therefore, since an additional mask process is not required to form the first contact electrode 710 and the second contact electrode 720, process efficiency may be improved. Since the embodiment is the same as the embodiment of FIG. 6 except that the third insulating layer 530 is omitted, descriptions will not be repeated.

Hereinafter, a method of manufacturing the display device 10 according to the embodiment of FIG. 3 will be described.

FIGS. 8 to 17 are cross-sectional views illustrating the processes of a method of manufacturing the display device according to the embodiment of FIG. 3.

Figure 8:
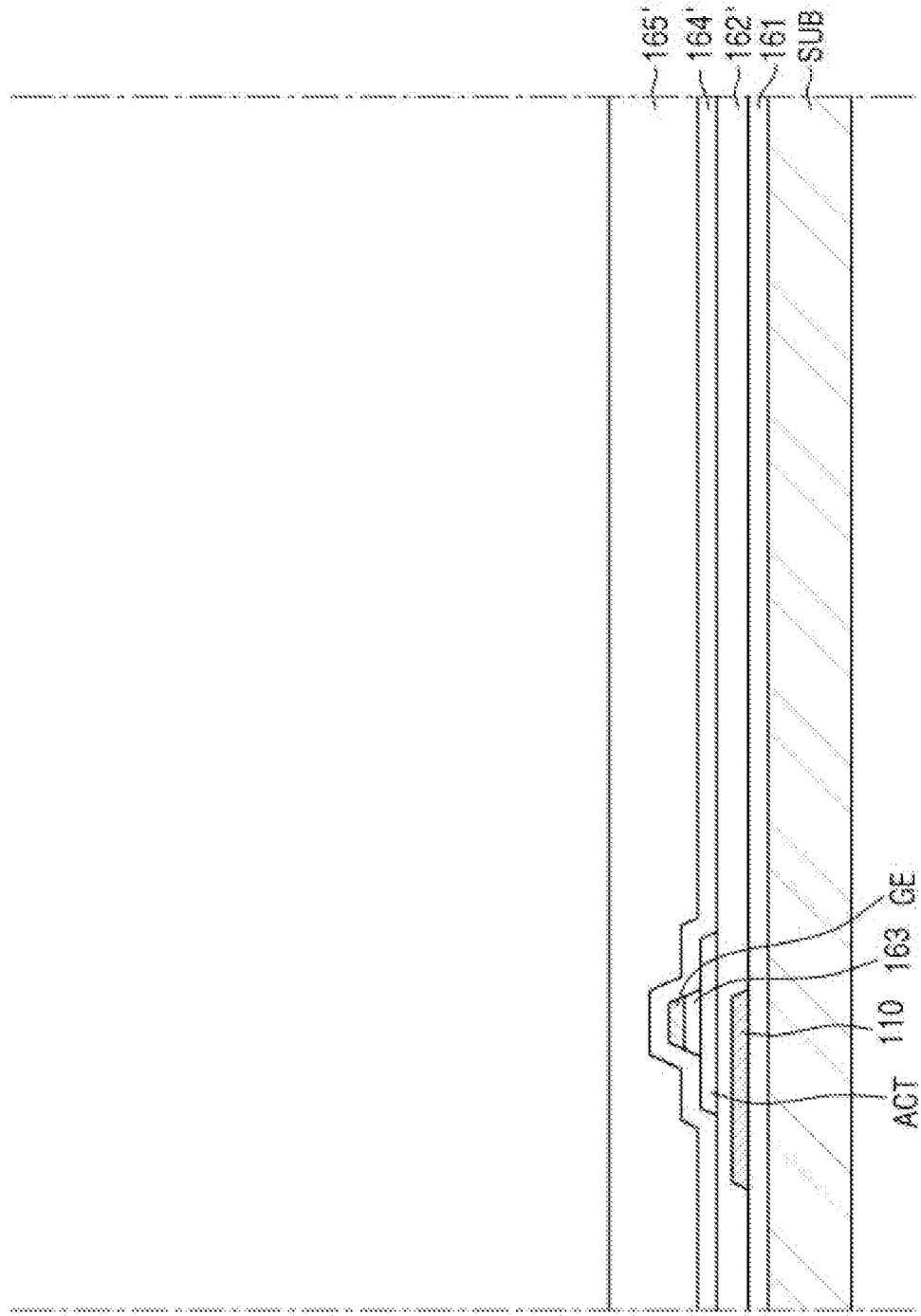
FIGS. 8 to 17 are schematic cross-sectional views illustrating the processes of a method of manufacturing the display device according to the embodiment of FIG. 3.

First, referring to FIG. 8, a patterned lower metal layer 110, a patterned semiconductor layer, a patterned gate conductive layer, and material layers 164' and 165' for first and second interlayer insulating layers are formed on a substrate SUB.

A barrier layer 161 is formed entirely on a surface of the substrate SUB, and a patterned lower metal layer 110 is formed on a surface of the barrier layer 121. The patterned lower metal layer 110 may be formed by a mask process. For example, a material layer for a lower metal layer may be entirely deposited on the barrier layer 121 and patterned through a photolithography process to form the lower metal layer 110 as shown in FIG. 8.

Subsequently, a material layer 162' for a buffer layer is formed entirely on a surface of the barrier layer 161 on which the lower metal layer 110 is formed. Subsequently, a patterned semiconductor layer including the active layer (active material layer) ACT of the transistor TR is formed on the material layer 162' for a buffer layer. The patterned semiconductor layer may be formed by a mask process. For example, a material layer for a semiconductor layer may be entirely deposited on the material layer 162' for a buffer layer and patterned through a photolithography process to form the patterned semiconductor layer including the active material layer ACT of the transistor TR as shown in FIG. 8.

Subsequently, a patterned gate insulating layer 163 and a patterned gate conductive layer are formed on the material layer 162' for a buffer layer on which the semiconductor layer is formed. As described above, the patterned gate conductive layer may include the gate electrode GE of the transistor TR. The patterned gate insulating layer 163 and the patterned gate conductive layer may be formed by a single mask process. A material layer for a gate insulating layer may be entirely deposited on the material layer 162' for a buffer layer on which the semiconductor layer is formed. Subsequently, a material layer for a gate conductive layer may be deposited on the material layer for a gate insulating layer. Subsequently, a photoresist layer may be applied onto the material layer for a gate conductive layer and may be formed into a photoresist pattern through exposure and development, and the material layer for a gate conductive layer and the material layer for a gate insulating layer may be etched (for example, sequentially etched) using the photoresist pattern as an etching mask. Thereafter, the photoresist pattern is removed through a strip or ashing process. The example here uses a photoresist pattern as an etching mask until patterning of the gate insulating layer 163. In other examples, the patterned upper layer (for example, the patterned gate conductive layer) may be used as a hard mask for etching the lower layer (for example, the material layer for a gate insulating layer). The photoresist pattern may be used as an etching mask together with a hard mask. As another example, after the hard mask is formed, the photoresist pattern may be removed, and the lower layer may be etched using the hard mask as an etching mask.

Subsequently, a material layer 164' for a first interlayer insulating layer and a material layer 165' for a second interlayer insulating layer are sequentially stacked on the material layer 162' for a buffer layer on which the gate conductive layer is formed. The material layer 164' for a first interlayer insulating layer and the material layer 165' for a second interlayer insulating layer may be formed by being entirely deposited on the material layer 162' for a buffer layer on which the gate conductive layer is formed.

Figure 9:
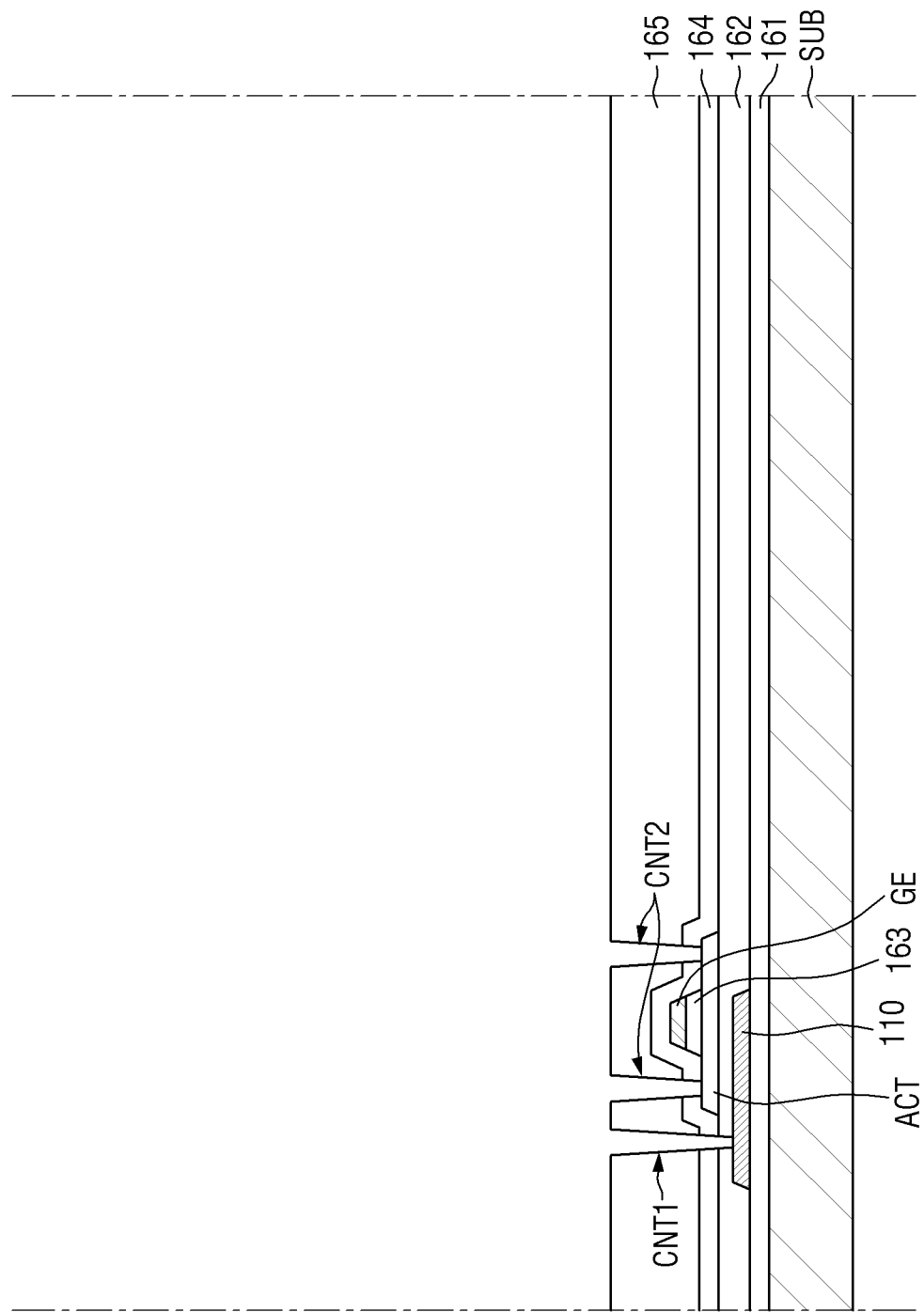

Subsequently, referring to FIG. 9, contact holes CNT2 penetrating the first interlayer insulating layer 164 and the second interlayer insulating layer 165 and contact holes CNT1 penetrating the first interlayer insulating layer 164, the second interlayer insulating layer 165, and the buffer layer 162 are formed.

A contact hole CNT1 exposing a part of the lower metal layer 110 and a contact hole CNT2 exposing a part (source region and drain region) of the semiconductor layer including the active layer (active material layer) ACT of the transistor TR are formed. The contact holes CNT1 and CNT2 may be formed by a mask process. The contact hole CNT1 exposing a part of the lower metal layer 110 and the contact hole CNT2 exposing a part of the semiconductor layer may be formed by the same mask. For example, a photoresist pattern exposing a part of the lower metal layer 110 and a part of the semiconductor layer is formed on the material layer 165' for a second interlayer insulating layer, and the material layer 164' for a first interlayer insulating layer, the material layer 165' for a second interlayer insulating layer, and the material layer 162' for a buffer layer are etched using the photoresist pattern as an etching mask to form the contact hole CNT1 exposing a part of the lower metal layer 110 and the contact hole CNT2 exposing a part of the semiconductor layer. While the material layer 162' for a buffer layer is etched to form a contact hole CNT1 exposing a part of the lower metal layer 110, the semiconductor layer including the active material layer ACT of the transistor TR may be exposed to an etchant. Since an additional mask process is not required to form the contact hole CNT1 exposing a part of the lower metal layer 110 and the contact hole CNT2 exposing a part of the semiconductor layer, process efficiency may be improved.

The contact hole CNT1 exposing a part of the lower metal layer 110 and the contact hole CNT2 exposing a part of the semiconductor layer may be sequentially formed using different masks from each other. For example, a first photoresist pattern exposing a part of the lower metal layer 110 may be formed on the material layer 165' for a second interlayer insulating layer, and the material layer 164' for a first interlayer insulating layer, the material layer 165' for a second interlayer insulating layer, and the material layer 162' for a buffer layer are etched using the first photoresist pattern as an etching mask to form the contact hole CNT1 exposing a part of the lower metal layer 110. Subsequently, after the first photoresist pattern is removed, a second photoresist pattern exposing a part of the semiconductor layer may be formed on the material layer 165' for a second interlayer insulating layer, and the material layer 164' for a first interlayer insulating layer and the material layer 165' for a second interlayer insulating layer may be etched using the second photoresist pattern as an etching mask to form the contact hole CNT2 exposing a part of the semiconductor layer. In case that the contact hole CNT1 exposing a part of the lower metal layer 110 is first formed and the contact hole CNT2 exposing a part of the semiconductor layer is formed using a separate mask, damage to the surface of the semiconductor layer may be suppressed.

Figure 10:
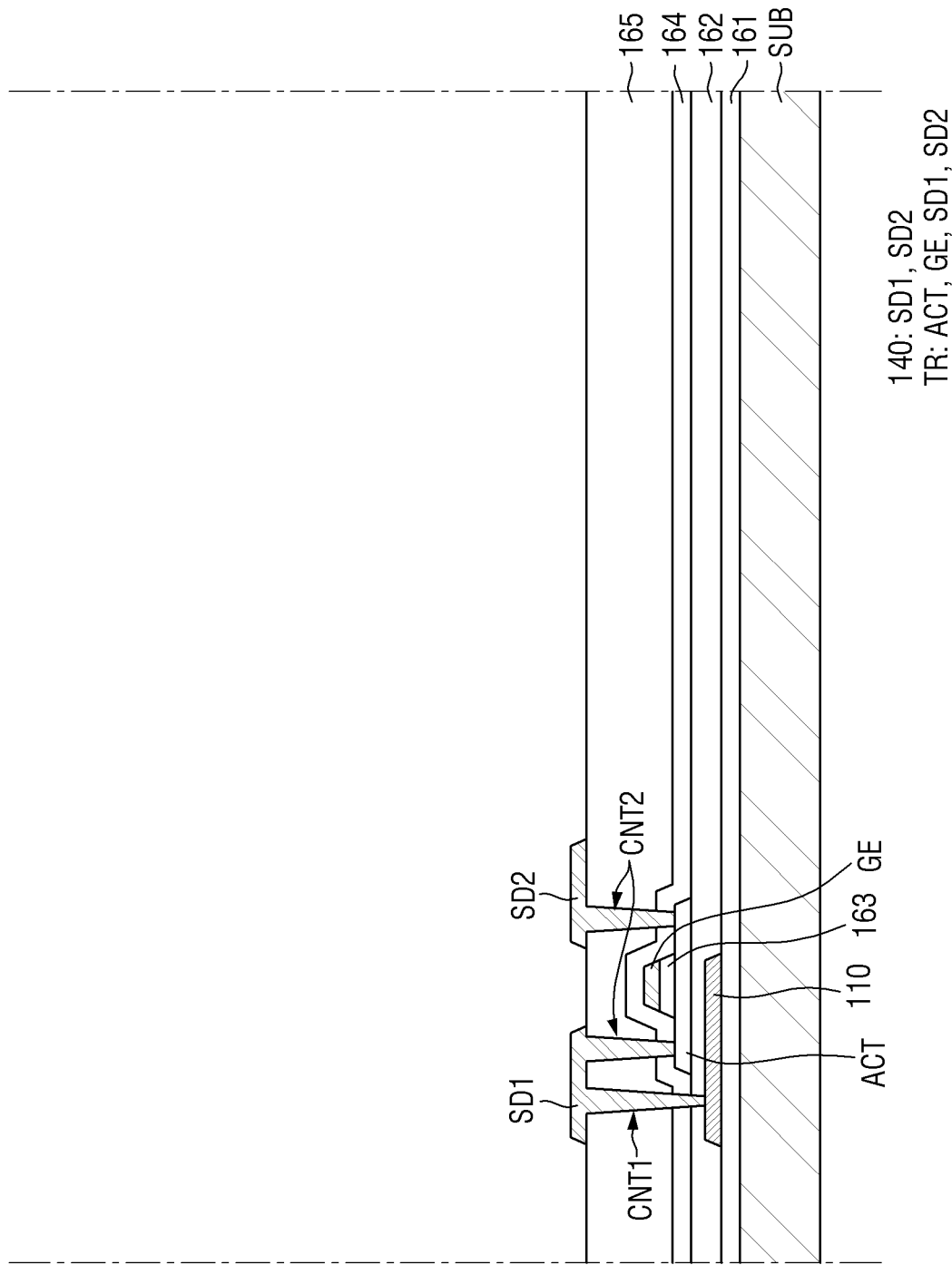

Subsequently, referring to FIG. 10, a patterned first conductive layer 140 is formed on the second interlayer insulating layer 165. The patterned first conductive layer 140 may be formed by a mask process. For example, a material layer for a first conductive layer may be deposited (for example, entirely deposited) on the second interlayer insulating layer 165. In the deposition process, the material layer for a first conductive layer may be deposited to the insides of the contact holes CNT1 and CNT2, so that the material layer for a first conductive layer may be connected to the lower metal layer 110 and the active layer (active material layer) ACT of the transistor TR. Subsequently, a photoresist layer may be applied onto the material layer for a first conductive layer and is formed into a photoresist pattern through exposure and development, and the material layer for a first conductive layer may be etched using the photoresist pattern as an etching mask. Thereafter, the photoresist pattern may be removed through a strip or ashing process to form a patterned first conductive layer 140 including the first source/drain electrode SD1 of the transistor TR and the second source/drain electrode SD2 of the transistor TR as shown in FIG. 10.

Subsequently, a patterned passivation layer 166 and a patterned second conductive layer 170 may be formed on the first conductive layer 140. Referring to FIGS. 11 to 14, the patterned passivation layer 166 and the patterned second conductive layer 170 may be formed by a single mask process. For example, the process of forming the patterned passivation layer 166 and the patterned second conductive layer 170 on the first conductive layer 140 includes a process of depositing (for example, entirely and sequentially depositing) a passivation material layer 166' and a second conductive material layer 170' on the second interlayer insulating layer 165 on which the first conductive layer 140 is formed, a process of forming a photoresist pattern PR on the material layer 170' for a second conductive layer, and a process of etching (for example, sequentially etching) the material layer 170' for a second conductive layer and the material layer 166' for a passivation layer using the photoresist pattern PR as an etching mask.

Figure 11:
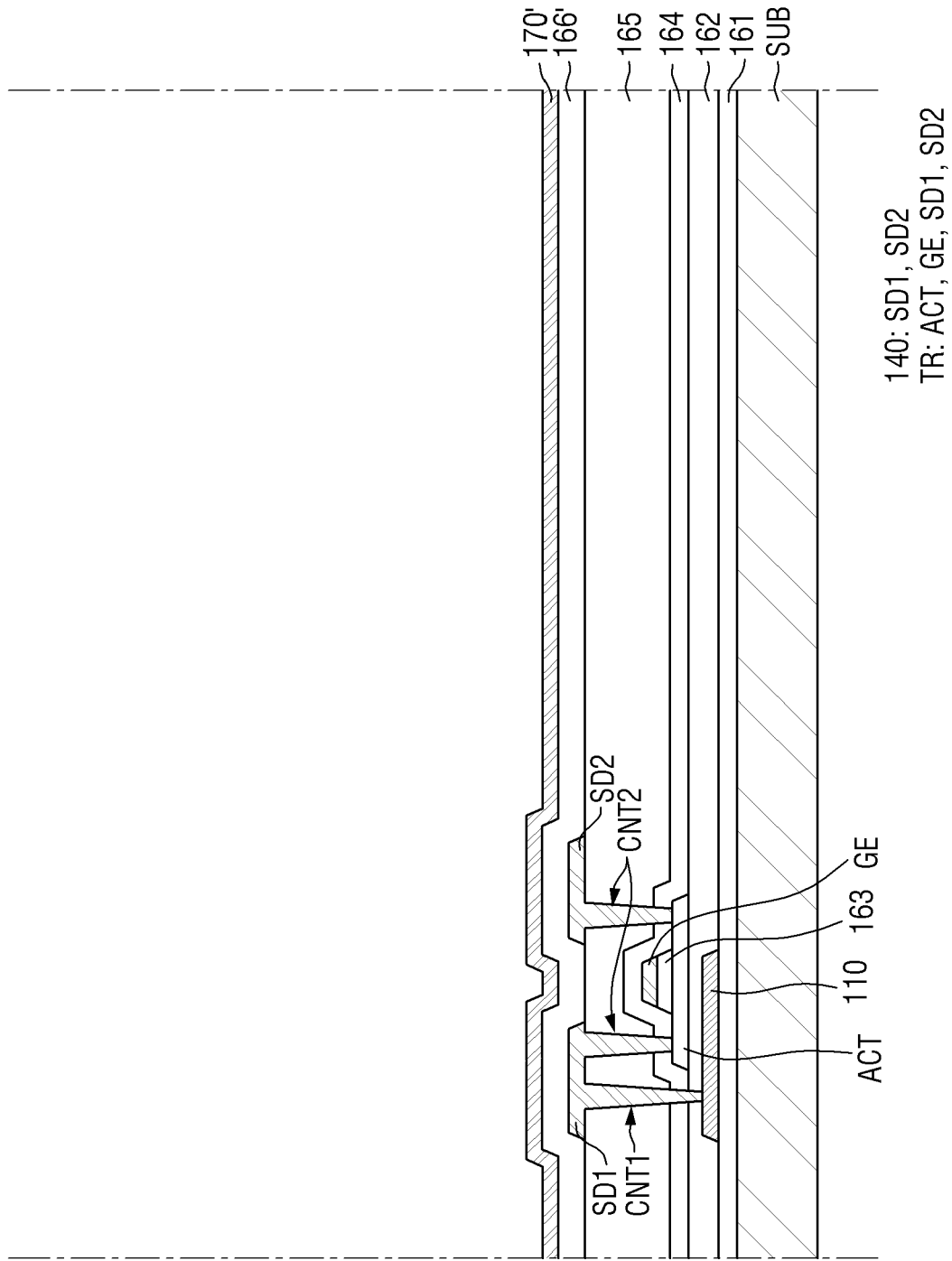

Subsequently, referring to FIG. 11, the material layer 166' for a passivation layer and the material layer 170' for a second conductive layer may be sequentially deposited on the second interlayer insulating layer 165 on which the first conductive layer 140 is formed. For example, the material layer 166' for a passivation layer may be deposited (for example, entirely deposited) on the second interlayer insulating layer 165 on which the patterned first conductive layer 140 is formed. In the embodiment, the material layer 166' for a passivation layer may be entirely deposited on the second interlayer insulating layer 165 without forming a separate contact hole. Subsequently, the material layer 170' for a second conductive layer may be entirely deposited on the material layer 166' for a passivation layer.

Figure 12:
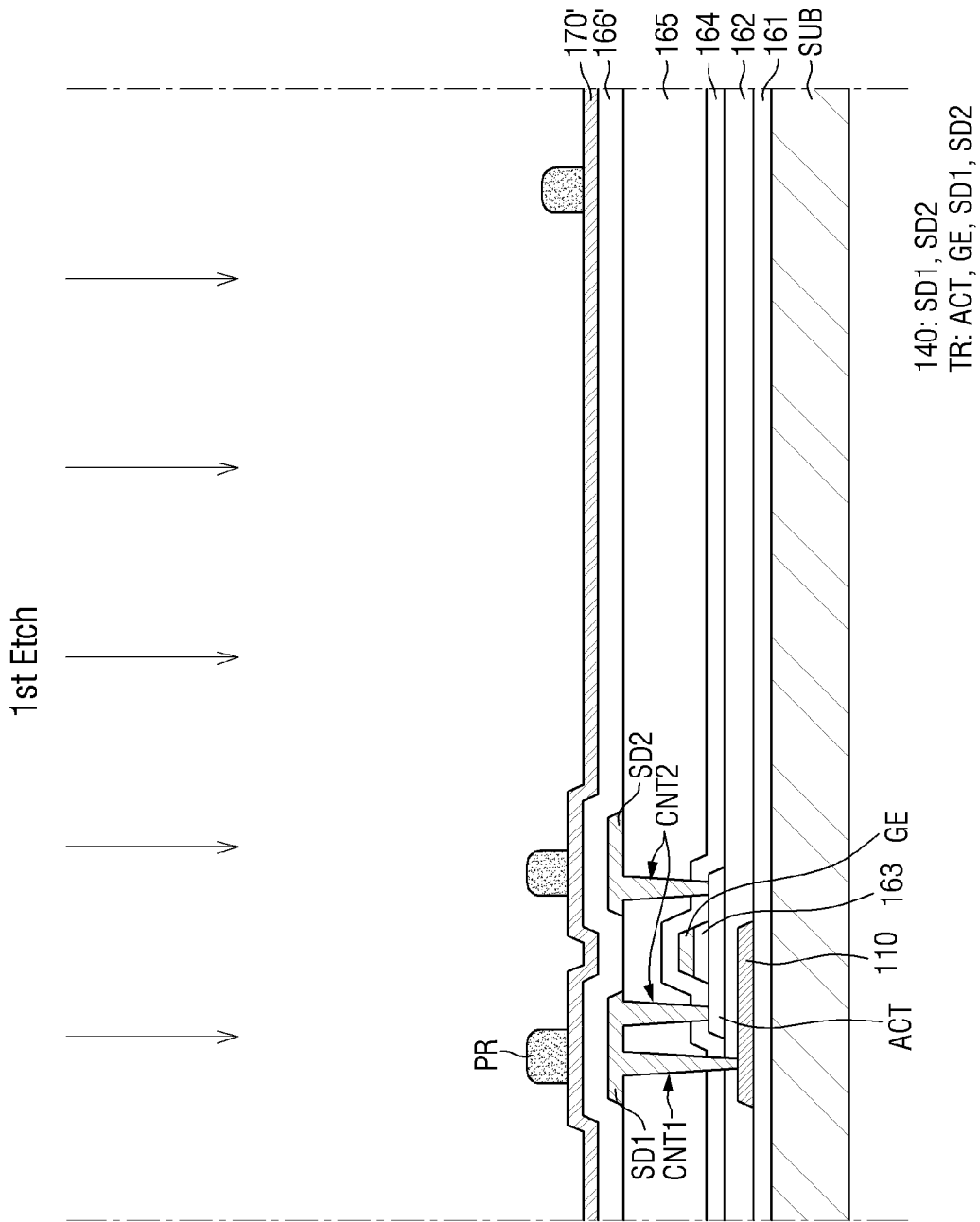
Figure 13:
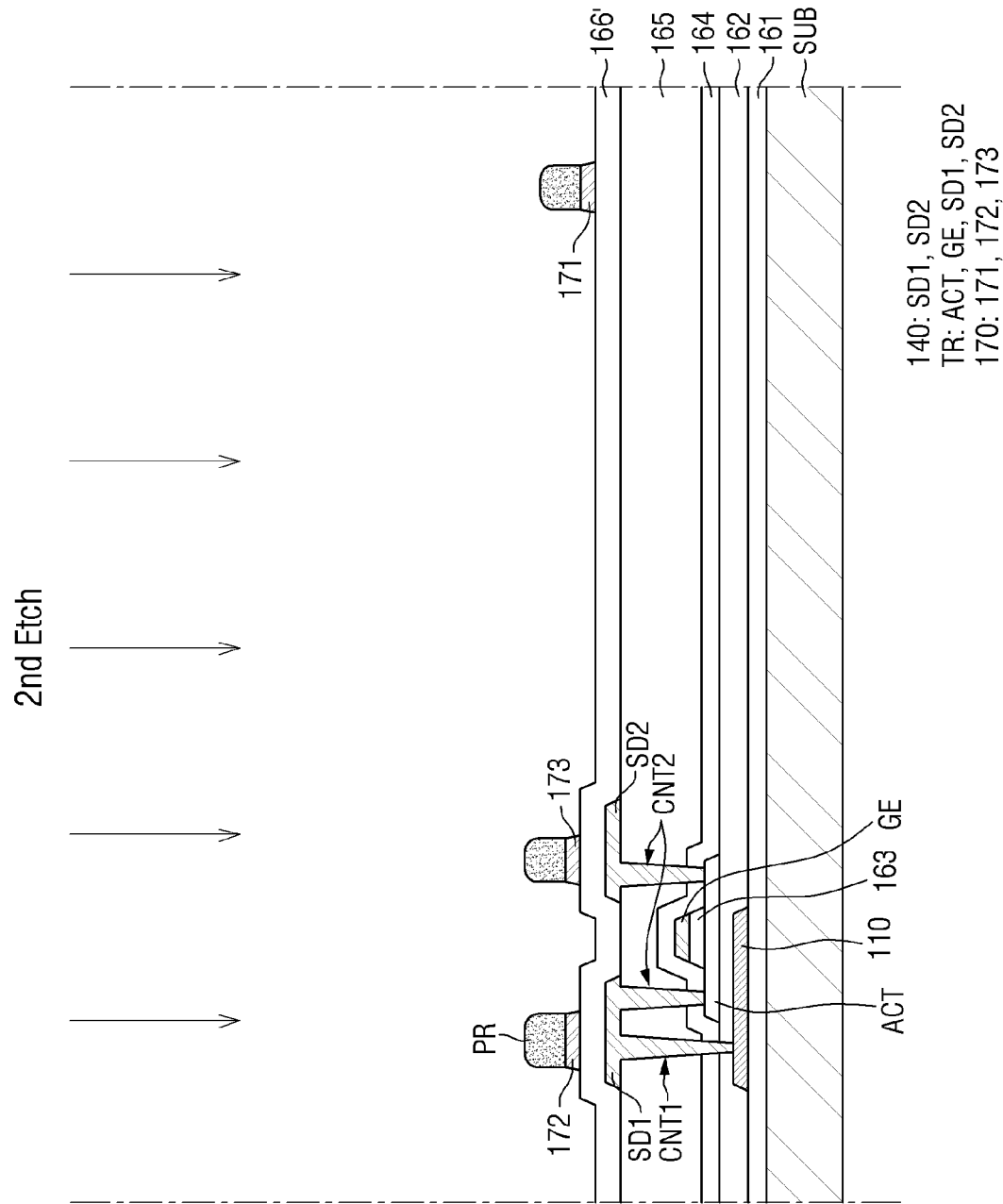
Figure 14:
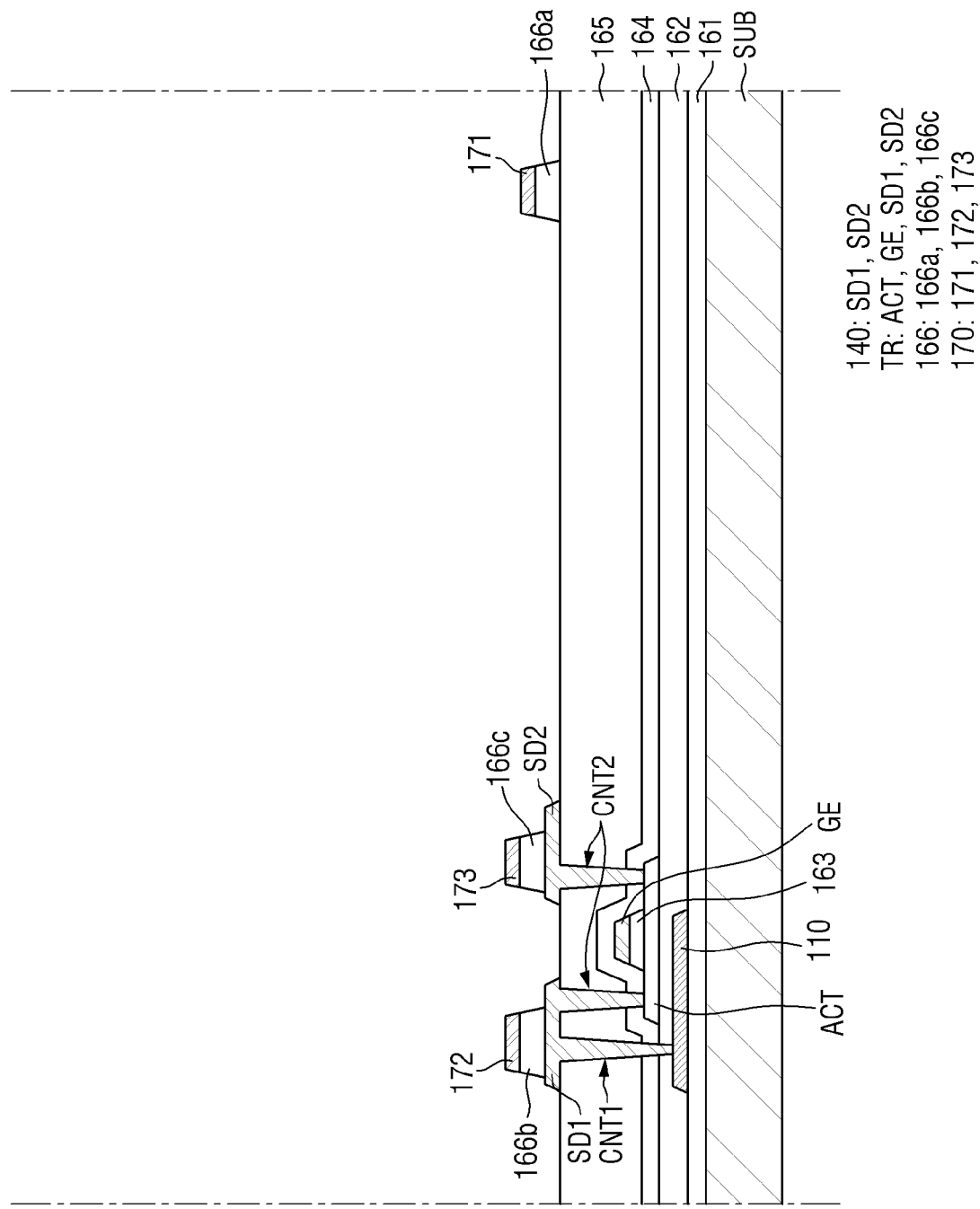

Subsequently, referring to FIGS. 12 and 13, a photoresist pattern PR may be formed on the material layer 170' for a second conductive layer, and the material layer 170' for a second conductive layer and the material layer 166' for a passivation layer may be etched (for example, sequentially etched) using the photoresist pattern PR as an etching mask. A photoresist pattern PR may be formed on the material layer 170' for a second conductive layer, and the material layer 170' for a second conductive layer is first etched using the photoresist pattern PR as an etching mask. For example, a photoresist layer may be applied onto the material layer 170' for a second conductive layer and may be formed into a photoresist pattern PR having a pattern shape of the second conductive layer 170 to remain through exposure and development. Subsequently, the material layer 170' for a second conductive layer may be first etched using the photoresist pattern PR as an etching mask to form the patterned second conductive layer 170 as shown in FIG. 13. Subsequently, the material layer 166' for a passivation layer may be second etched using the photoresist pattern PR as an etching mask. Thereafter, the photoresist pattern is removed through a strip or ashing process to form a patterned second conductive layer 170 and a patterned passivation layer 166 as shown in FIG. 14.

The example here uses a photoresist pattern PR as an etching mask until patterning of the passivation layer 166, the patterned second conductive layer 170 may be used as a hard mask for etching the material layer 166' for a passivation layer. The photoresist pattern PR may be used as an etching mask together with a hard mask. As another example, after the hard mask is formed, the photoresist pattern PR may be removed, and the material layer 166' for a passivation layer may be etched using the hard mask as an etching mask.

In the process, the patterned second conductive layer 170 and the patterned passivation layer 166 may be formed in the same pattern. Accordingly, the sidewall of the second conductive layer 170 and the passivation layer 166 may be aligned substantially in parallel to each other. Further, the second conductive layer 170 may cover the upper surface of the passivation layer 166. The passivation layer 166 may be disposed between the second conductive layer 170 and the layer disposed under the second conductive layer 170, and a separate contact hole penetrating the passivation layer 166 and connecting the second conductive layer 170 and the underlying conductive layer (for example, the first conductive layer 140) may not be formed in the passivation layer 166.

Figure 15:
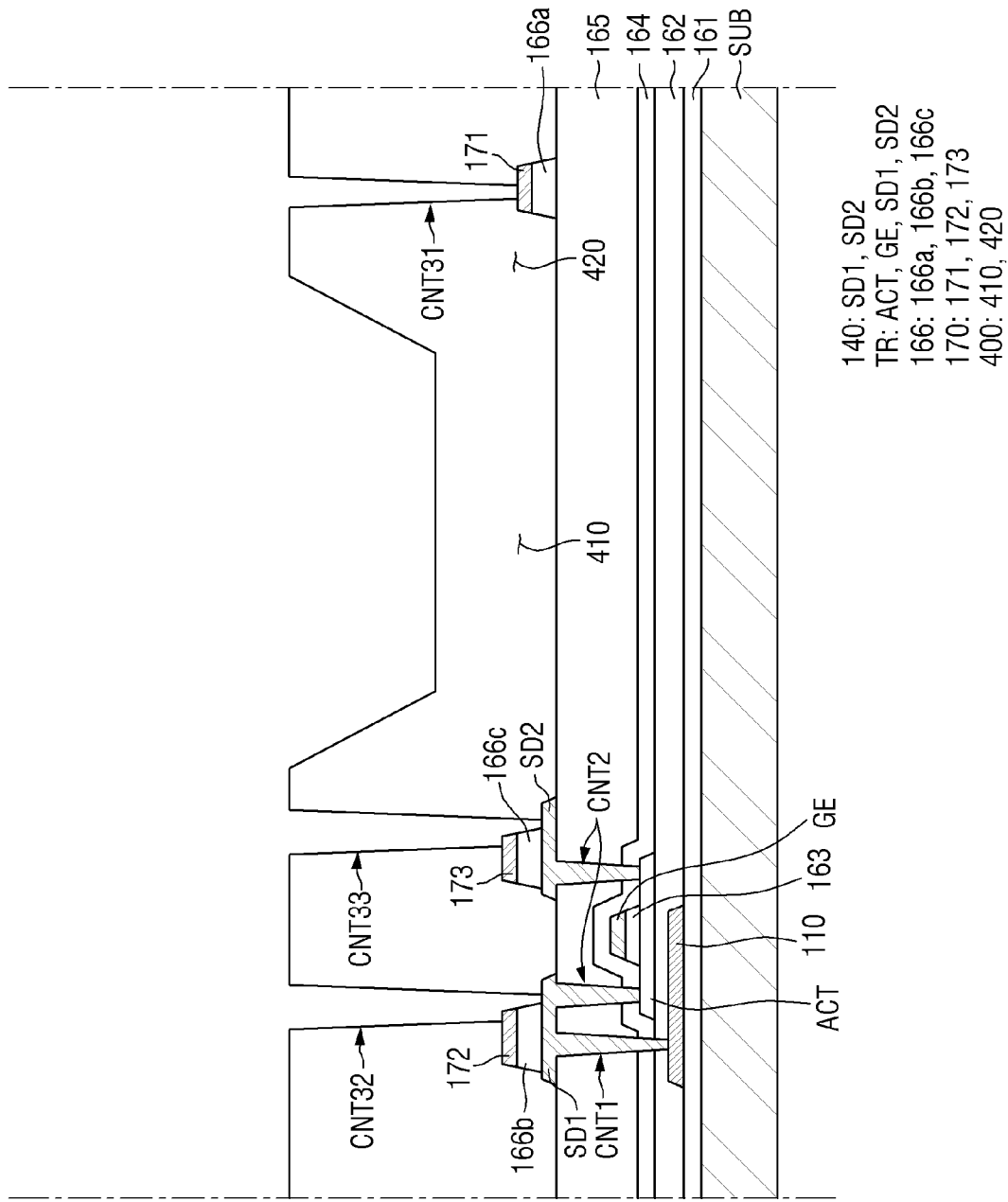

Subsequently, referring to FIG. 15, a patterned via layer 400 is formed on the second conductive layer 170. The patterned via layer 400 has a substantially flat surface, but may have different heights for each region. For example, the height of the first region 410 of the via layer 400, which is a region where multiple light emitting elements ED are disposed in the light emission area EMA, may be smaller than the height of the second region 420 of the via layer 400, which is a region where the light emitting elements ED are not disposed.

The patterned via layer 400 may include contact holes CNT31, CNT32, and CNT33 exposing parts of the patterned second conductive layer 170 and the first conductive layer 140. The patterned via layer 400 includes a first contact hole CNT31 exposing a part of the first power line 171, a second contact hole CNT32 exposing parts of the second power line 172, the second region 166b of the passivation layer 166, and the first source/drain electrode SD1 of the transistor TR, and a third contact hole CNT33 exposing parts of the first conductive pattern 173, the third region 166c of the passivation layer 166, and the second source/drain electrode SD2 of the transistor TR.

The first contact hole CNT31 may expose a part of the upper surface of the first power line 171 in the third direction. The sidewall of the via layer 400 constituting the first contact hole CNT31 may overlap the first power line 171 and the first region 166a of the passivation layer 166 disposed under the first power line 171 in the third direction DR3.

The second contact hole CNT32 may overlap the second power line 172 and the first source/drain electrode SD1 of the transistor TR in addition to a boundary region between the second power line 172 and the first source/drain electrode SD1 of the transistor TR in the third direction DR3 in a plan view.

The sidewall of the second power line 172 and the second region 166b of the passivation layer 166 disposed under the second power line 172 may constitute the second contact hole CNT32 together with the sidewall of the via layer 400.

The third contact hole CNT33 may overlap the first conductive pattern 173 and the second source/drain electrodes SD2 of the transistor TR in addition to a boundary region between the first conductive pattern 173 and the second source/drain electrodes SD2 of the transistor TR in the third direction DR3 in a plan view. The sidewall of the first conductive pattern 173 and the third region 166c of the passivation layer 166 disposed under the first conductive pattern 173 may constitute the third contact hole CNT33 together with the sidewall of the via layer 400.

The via layer 400 may be formed of, for example, an organic material including a photosensitive material. The patterned via layer 400 may be formed by forming contact holes CNT31, CNT32, and CNT33 through exposure and development after applying an organic material layer for the via layer. The via layer 400 having a different height for each region may be formed using a halftone mask or a slit mask.

Figure 16:
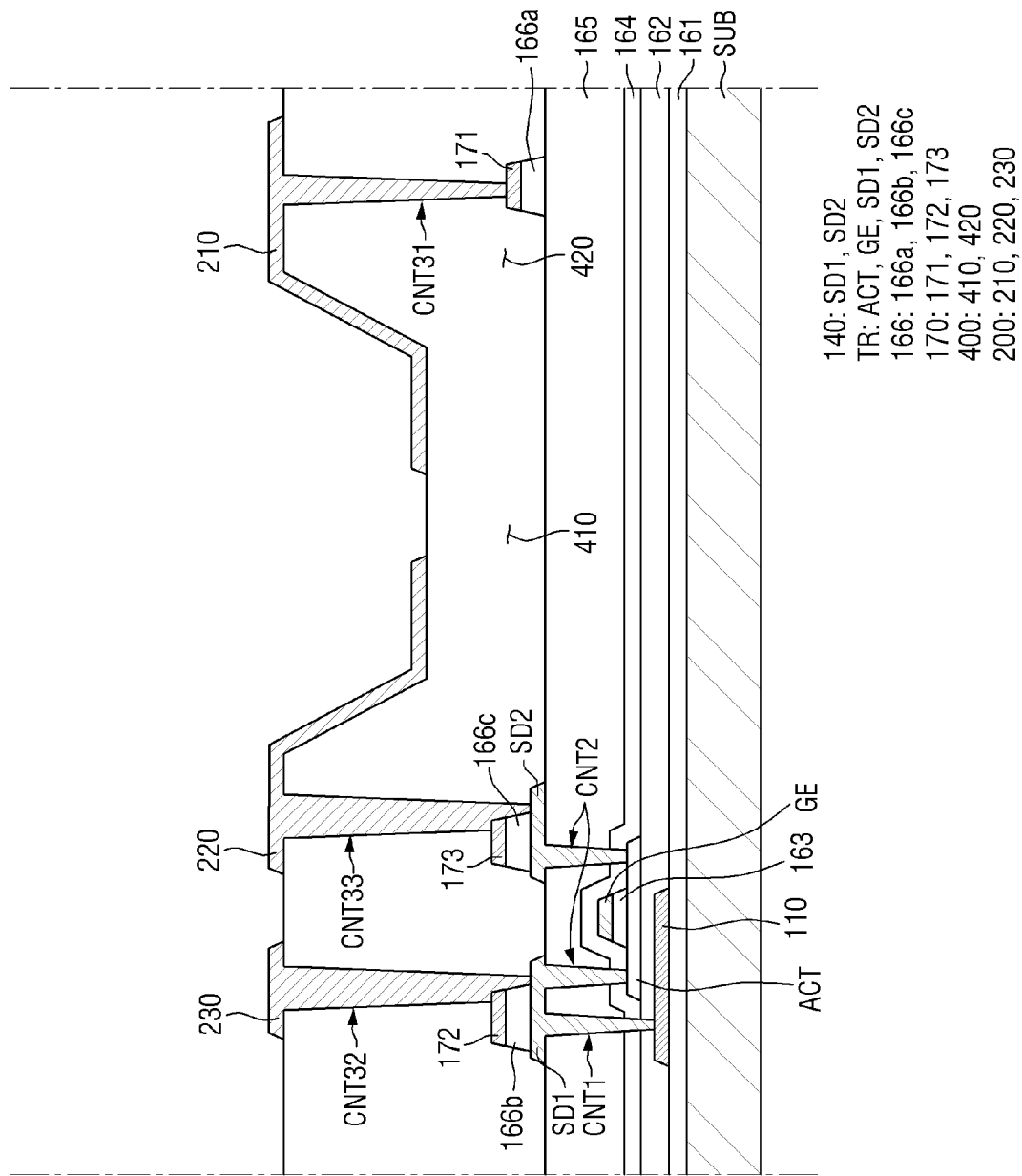

Subsequently, referring to FIG. 16, a patterned third conductive layer 200 is formed on the patterned via layer 400. The patterned third conductive layer 200 may be formed by a mask process. For example, a material layer for a third conductive layer may be entirely deposited on the via layer 400. In the deposition process, the material layer for a third conductive layer is deposited to the insides of the first to third contact holes CNT31, CNT32, and CNT33, so that the material layer for a third conductive layer may be connected to a part of the first conductive layer 140 and a part of the second conductive layer 170.

In the deposition process, the material layer for a third conductive layer is deposited up to the first contact hole CNT31, so that the material layer for a third conductive layer may be connected to the first power line 171 of the second conductive layer 170. The material layer for a third conductive layer deposited up to the first contact hole CNT31 may contact the upper surface of the first power line 171.

The material layer for a third conductive layer is deposited up to the second contact hole CNT32, so that the material layer for a third conductive layer may be connected to the first source/drain electrode SD1 of the first conductive layer 140 and the second power line 172 of the second conductive layer 170. The material layer for a third conductive layer deposited up to the second contact hole CNT32 may contact the upper surface and a sidewall of the second power line 172, a sidewall of the second region 166b of the passivation layer 166 aligned in parallel with a sidewall of the second power line 172, and the upper surface of the first source/drain electrode SD1.

The material layer for a third conductive layer is deposited up to the third contact hole CNT33, so that the material layer for a third conductive layer may be connected to the second source/drain electrode SD2 of the first conductive layer 140 and the first conductive pattern 173 of the second conductive layer 170. The material layer for a third conductive layer deposited up to the third contact hole CNT33 may contact the upper surface and a sidewall of the first conductive pattern 173, a sidewall of the third region 166c of the passivation layer 166 aligned in parallel with a sidewall of the first conductive pattern 173, and the upper surface of the second source/drain electrode SD2.

Subsequently, a photoresist layer may be applied onto the material layer for a third conductive layer and may be formed into a photoresist pattern having a pattern shape of the third conductive layer 200 to remain through exposure and development, and the material layer for a third conductive layer may be etched using the photoresist pattern as an etching mask. Thereafter, the photoresist pattern may be removed through a strip or ashing process to form a first electrode 210, a second electrode 220, and a connection pattern 230 as shown in FIG. 16.

Figure 17:
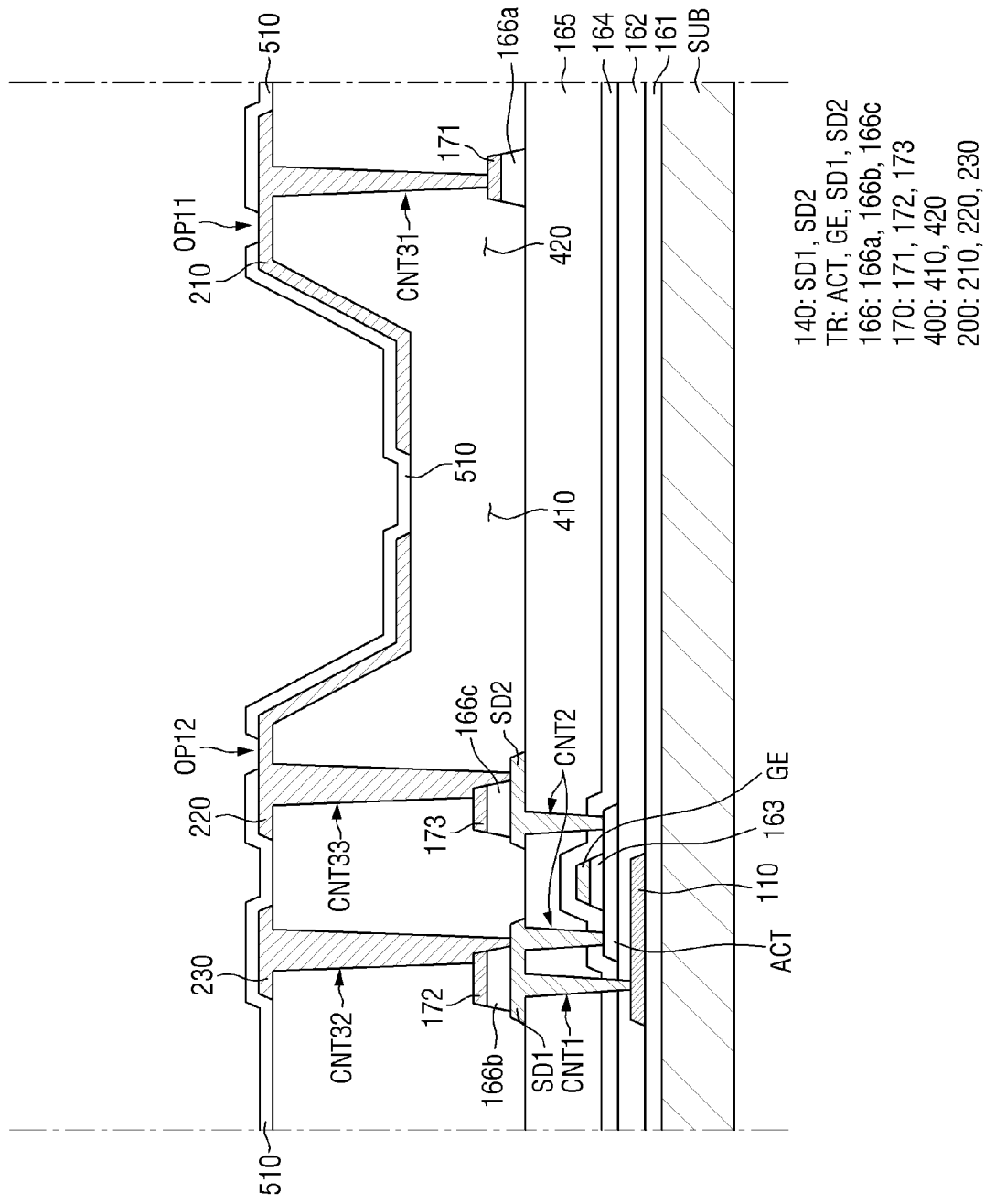

Subsequently, referring to FIG. 17, a patterned first insulating layer 510 may be formed on the patterned third conductive layer 200. The patterned first insulating layer 510 may include a first opening OP11 exposing a part of the first electrode 210 and a second opening OP2 exposing a part of the second electrode 220. The first opening OP11 and the second opening OP2 may be formed by a mask process. For example, a material layer for a first insulating layer may be entirely deposited on the via layer 400 on which the third conductive layer 200 is formed. Subsequently, a photoresist pattern exposing parts of the first electrode 210 and the second electrode 220 is formed, and the material layer for a first insulating layer may be etched using the photoresist pattern as an etching mask to form the first opening OP11 and the second opening OP2. Subsequently, the photoresist pattern may be removed through a strip or ashing process to complete the patterned first insulating layer 510 as shown in FIG. 17.

Subsequently, as shown in FIG. 3, a first bank 600, a light emitting element ED, a second insulating layer 520, a first contact electrode 710, a third insulating layer 530, a second contact electrode 720, and a fourth insulating layer 540 may be formed through further processes.

According to the method of manufacturing a display device according to the embodiment, the via layer 400 having a different height for each region may be formed through a single mask process using a halftone mask, so that the via layer 400 of the embodiment may simultaneously perform a step compensation function for compensating for a lower step difference and a bank function for arranging the light emitting elements ED. Accordingly, an additional mask process of forming a separate bank on the via layer may be omitted, thereby improving process efficiency of the display device.

Further, the passivation layer 166 and the second conductive layer 170, disposed on the first conductive layer 140, may be formed in the same pattern by a single mask process. Although the passivation layer 166 does not include a separate contact hole penetrating the passivation layer 166 and connecting the second conductive layer 170 and the first conductive layer 140, the third conductive layer 200 disposed on the via layer 400 may connect the first conductive layer 140 and the second conductive layer 170 to each other through side contacts through the contact holes CNT32 and CNT33 penetrating the via layer 400. Accordingly, as the third conductive layer 200 is used as a connection electrode connecting the first conductive layer 140 and the second conductive layer 170, in the process of forming the passivation layer 166 interposed between the first conductive layer 140 and the second conductive layer 170, a separate mask process for forming a contact hole penetrating the passivation layer 166 and connecting the first conductive layer 140 and the second conductive layer 170 may be omitted. Therefore, in the process of forming the passivation layer 166, an additional mask process for forming a contact hole for connecting the first conductive layer 140 and the second conductive layer 170 is not required, so that process efficiency of the display device 10 may be improved.

As the passivation layer 166 is formed in the same pattern through the same mask process as the second conductive layer 170, an additional etching process for forming the contact holes CNT31, CNT32, and CNT33 connecting the first to third conductive layers 140, 170, and 200 to each other is not required, so that damage to the surfaces of the first conductive layer 140, the passivation layer 166, and the second conductive layer 170 may be prevented. As shown in FIG. 14, the patterned passivation layer 166 and the patterned second conductive layer 170 may be formed through a sequential etching process using the photoresist pattern formed through a single mask process as an etching mask, and as shown in FIG. 15, the contact holes CNT31, CNT32, and CNT33 connecting the first to third conductive layers 140, 170, and 200 to each other through exposure and development of the patterned via layer 400 including a photosensitive material using a single mask may be formed. Accordingly, after the process of forming the patterned passivation layer 166 and the patterned second conductive layer 170 to form contact holes CNT31, CNT32, and CNT33, the contact holes CNT31, CNT32, and CNT33 connecting the first to third conductive layers 140, 170, 200 to each other may be formed only by a process of forming the patterned via layer 400 without an additional process of etching the passivation layer. Therefore, since an additional etching process on the passivation layer is not required, damage to the surfaces of the layers disposed under the via layer 400 (for example, the first conductive layer 140, the passivation layer 166, and the second conductive layer 170) due to an etchant may be reduced.

Hereinafter, other embodiments will be described. In the following embodiments, descriptions are not repeated or may be simplified for the elements that were previously described.

Figure 18:
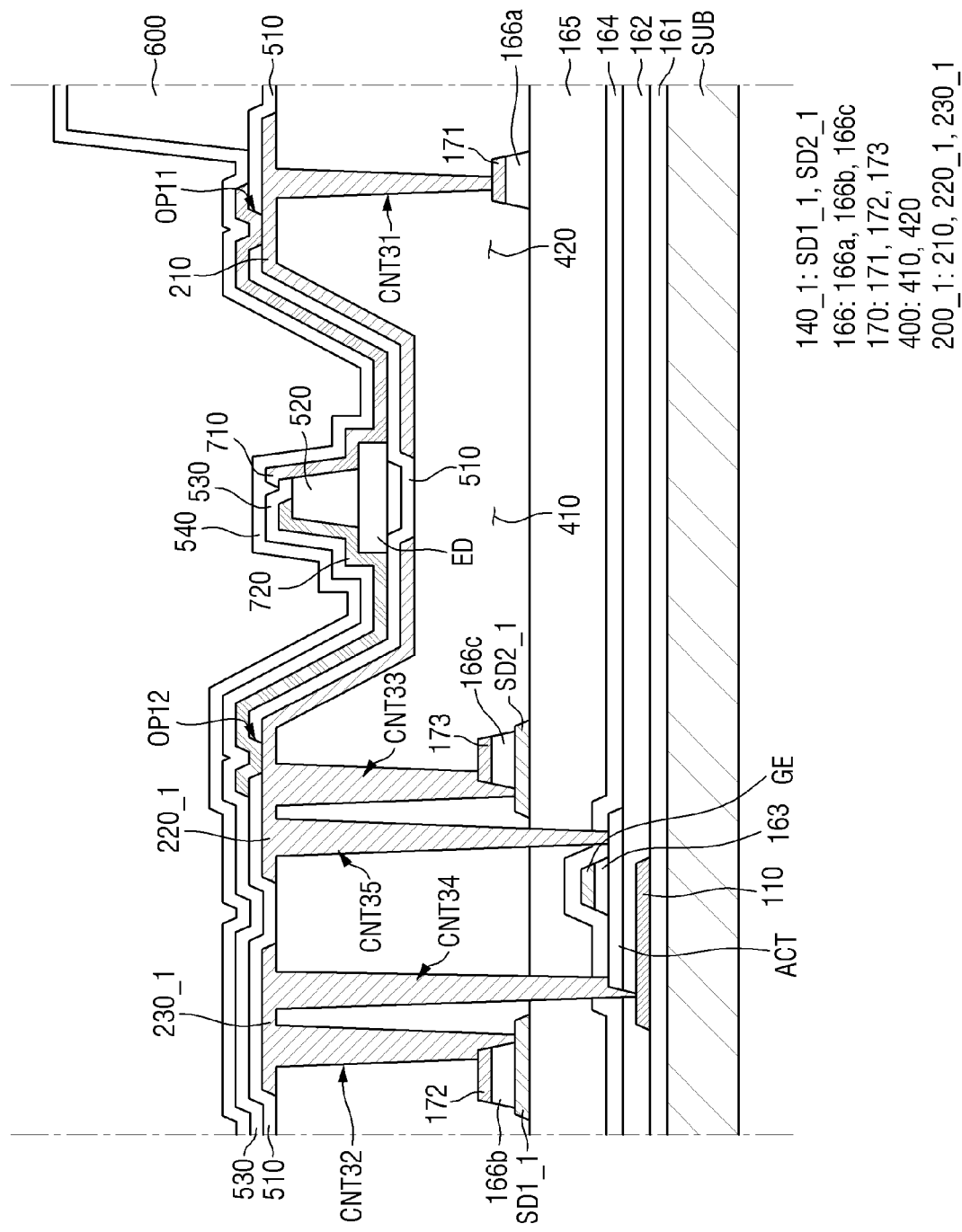
FIG. 18 is a schematic cross-sectional view of a display device according to an embodiment.

FIG. 18 is a cross-sectional view of a display device according to an embodiment.

Referring to FIG. 18, the display device is different from the display device of FIG. 3 in that a first conductive layer 140_1 is connected to a part of the semiconductor layer and a part of the lower metal layer 110 through a third conductive layer 200_1 without being connected to a part of the semiconductor layer and a part of the lower metal layer 110 through the contact hole CNT1 (refer to FIG. 3) penetrating the first and second interlayer insulating layers 164 and 165 and the contact hole CNT2 (refer to FIG. 3) penetrating the first and second interlayer insulating layers 164 and 165 and the buffer layer 162.

The first conductive layer 140_1 may be disposed on the second interlayer insulating layer 165. A separate contact hole may not be formed between the first conductive layer 140_1 and the semiconductor layer. Further, a separate contact hole may not be formed between the first conductive layer 140_1 and the lower metal layer. The first and second interlayer insulating layers 164 and 165 may be interposed between the first conductive layer 140_1 and the semiconductor layer, and the first and second interlayer insulating layers 164 and 165 and the buffer layer 162 may be interposed between the first conductive layer 140_1 and the lower metal layer 110.

The connection pattern 230 may connect a part of the semiconductor layer and the lower metal layer 110 through a fourth contact hole CNT34 penetrating the via layer 400, the first and second interlayer insulating layers 164 and 165, and the buffer layer 162.

The connection pattern 230 may connect the active layer (active material layer) ACT of the transistor TR and the lower metal layer 110 through the fourth contact hole CNT34 penetrating the via layer 400, the first and second interlayer insulating layers 164 and 165, and the buffer layer 162. The connection pattern 230 may electrically connect the first source/drain electrode SD1_1 of the transistor TR, the second power line 172, the active material layer ACT of the transistor TR, and the lower metal layer 110 to each other through the second contact hole CNT32 and the fourth contact hole CNT34.

The fourth contact hole CNT34 may overlap the active material layer ACT of the transistor TR and the lower metal layer 110 in the third direction DR3. The fourth contact hole CNT34 may overlap the active material layer ACT of the transistor TR and the lower metal layer 110 in addition to a boundary region between the active material layer ACT of the transistor TR and the lower metal layer 110. The fourth contact hole CNT34 may expose a part of the upper surface of the active material layer ACT of the transistor TR, one side wall of the active material layer ACT of the transistor TR, and a part of the upper surface of the lower metal layer 110.

The second electrode 220_1 may be connected to a part of the semiconductor layer through a fifth contact hole CNT35 penetrating the via layer 400 and the first and second interlayer insulating layers 164 and 165.

The second electrode 220_1 may be connected to the active material layer ACT of transistor TR through the fifth contact hole CNT35 penetrating the via layer 400 and the first and second interlayer insulating layers 164 and 165. The second electrode 220_1 may electrically connect the second source/drain electrode SD2_1 of the transistor TR, the first conductive pattern 173, and the active material layer ACT of the transistor TR to each other through the third contact hole CNT33 and the fifth contact hole CNT35.

The fifth contact hole CNT35 may overlap the active material layer ACT of the transistor TR in the third direction DR3. In the specification, although it is shown in the drawings that the fifth contact hole CNT35 and the third contact hole CNT33 are spaced apart from each other, the embodiments are not limited thereto. For example, the second electrode 220_1 may electrically connect the second source/drain electrodes SD2_1 of the transistor TR and the first conductive pattern 173, which are disposed on the active material layer ACT of the transistor TR, to each other through a contact hole simultaneously exposing them.

Hereinafter, a method of manufacturing the display device 10 according to the embodiment of FIG. 18 will be described.

FIGS. 19 to 24 are cross-sectional views illustrating the processes of a method of manufacturing the display device according to the embodiment of FIG. 18.

The processes of forming a barrier layer 161, a patterned lower metal layer 110, a buffer layer 162, a semiconductor layer, a patterned gate insulating layer 163, a patterned gate conductive layer, and first and second interlayer insulating layers 164 and 165 on a substrate SUB is the same as those of the embodiment of FIG. 8.

Figure 19:
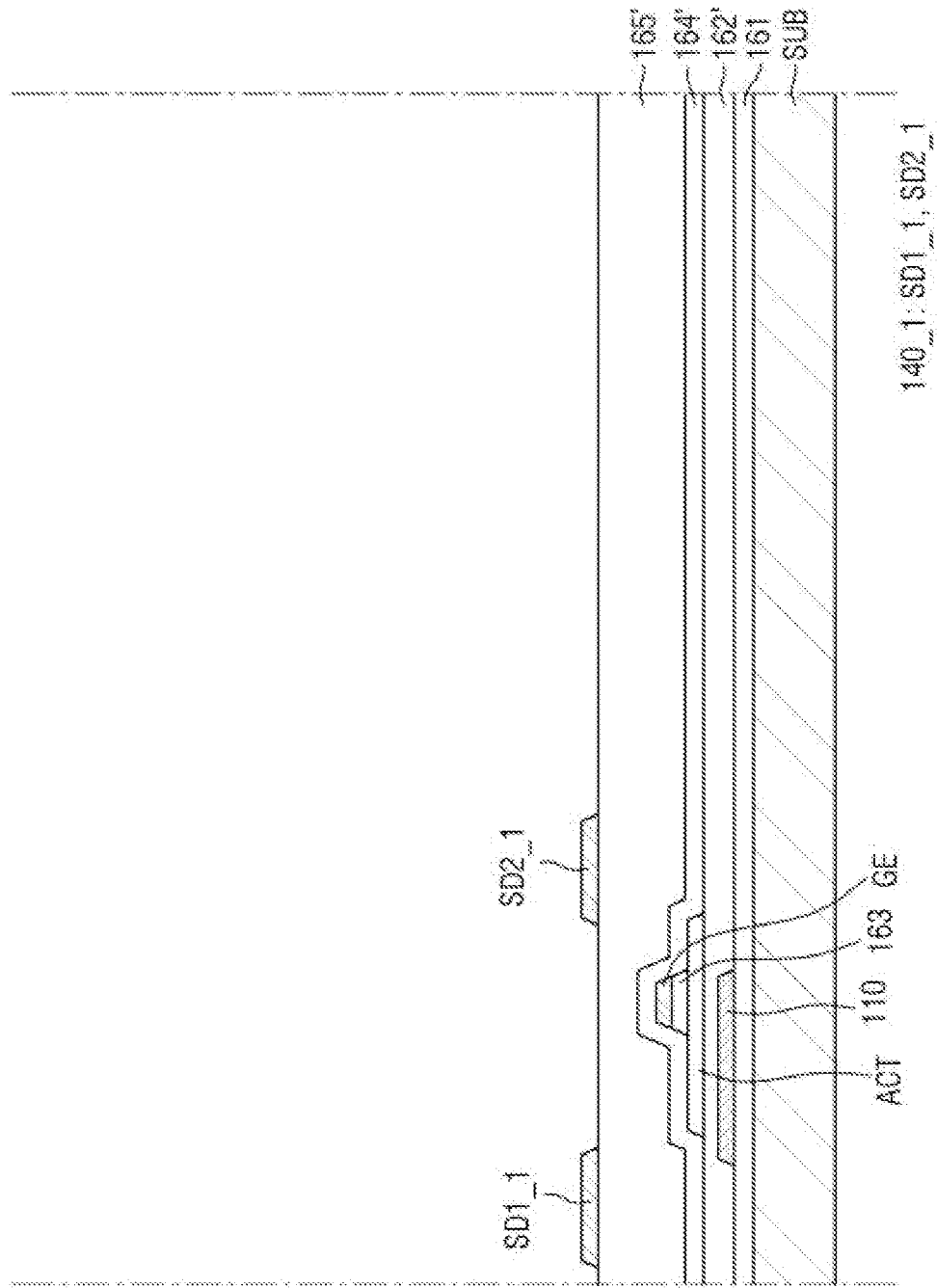
FIGS. 19 to 24 are schematic cross-sectional views illustrating the processes of a method of manufacturing the display device according to the embodiment of FIG. 18.

Subsequently, referring to FIG. 19, a patterned first conductive layer 140_1 is formed on a material layer 165' for a second interlayer insulating layer. As described above, the patterned first conductive layer 140_1 may be formed by a mask process. For example, a material layer for a first conductive layer may be deposited (for example, entirely deposited) on the material layer 165' for a second interlayer insulating layer. Subsequently, a photoresist layer may be applied onto the material layer for a first conductive layer and may be formed into a photoresist pattern through exposure and development, and the material layer for a first conductive layer may be etched using the photoresist pattern as an etching mask. Thereafter, the photoresist pattern may be removed through a strip or ashing process to form a patterned first conductive layer 140_1 including the first source/drain electrode SD1_1 of the transistor TR and the second source/drain electrode SD21 of the transistor TR as shown in FIG. 19.

In the process, a contact hole penetrating a material layer 162' for a buffer layer, a material layer 164' for a first interlayer insulating layer, and a material layer 165' for a second interlayer insulating layer may not be formed. Accordingly, a mask process for forming a contact hole connecting the first conductive layer 140_1 and the semiconductor layer and/or the lower metal layer 110 disposed below may be omitted.

Figure 20:
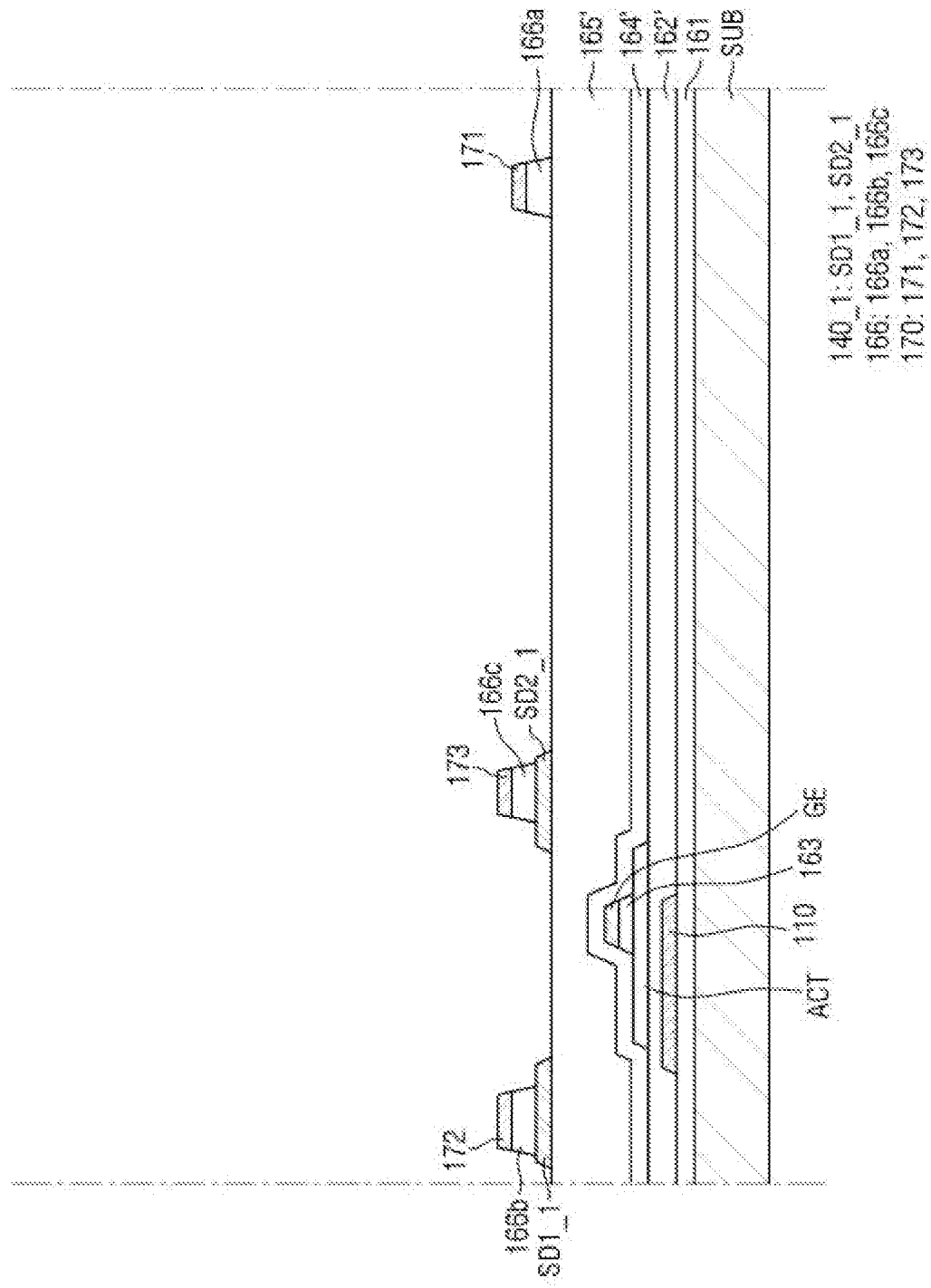

Subsequently, referring to FIG. 20, a patterned passivation layer 166 and a patterned second conductive layer 170 are formed on the first conductive layer 140_1. The patterned passivation layer 166 and the patterned second conductive layer 170 may be formed by the processes described above with reference to FIGS. 11 to 14. For example, a material layer 166' for a passivation layer and a material layer 170' for a second conductive layer may be sequentially deposited on the material layer 165' for a second interlayer insulating layer on which the first conductive layer 140_1 is formed. Subsequently, a photoresist layer is applied onto the material layer 170' for a second conductive layer and may be formed into a photoresist pattern through exposure and development, and the material layer 170' for a second conductive layer and the material layer 166' for a passivation layer may be sequentially etched using the photoresist pattern as an etching mask. Thereafter, the photoresist pattern may be removed through a strip or ashing process to form a patterned passivation layer 166 and a patterned second conductive layer 170 as shown in FIG. 20.

Subsequently, referring to FIG. 21, a patterned first via layer 400' is formed on the patterned second conductive layer 170. The patterned first via layer 400' has a substantially flat surface, but may have a different height for each region. For example, the height of the first region 410' of the first via layer 400', which is a region where multiple light emitting elements ED are disposed in the light emission area EMA, may be smaller than the height of the second region 420' of the first via layer 400', which is a region where the light emitting elements ED are not disposed.

The patterned first via layer 400' may include first to third openings CNT31', CNT32', and CNT33' exposing parts of the patterned second conductive layer 170 and the first conductive layer 140_1 and fourth and fifth openings CNT34' and CNT35' exposing a part of the material layer 165' for a second interlayer insulating layer.

The first to third openings CNT31', CNT32', and CNT33' may correspond to the above-described first to third contact holes CNT31, CNT32, and CNT33. The fourth and fifth openings CNT34' and CNT35' may expose the upper surface of the material layer 165' for a second interlayer insulating layer in the third direction DR3. The fourth opening CNT34' may overlap the active layer (active material layer) ACT of the transistor TR and the lower metal layer 110 in the third direction DR3. The fifth opening CNT35' may overlap the active material layer ACT of the transistor TR in the third direction DR3.

The patterned via layer 400' may be formed by forming the first to fifth openings CNT31', CNT32', CNT33', CNT34', and CNT35' through exposure and development after applying an organic material layer for a via layer. The first via layer 400' having a different height for each region may be formed using a halftone mask or a slit mask.

Figure 22:
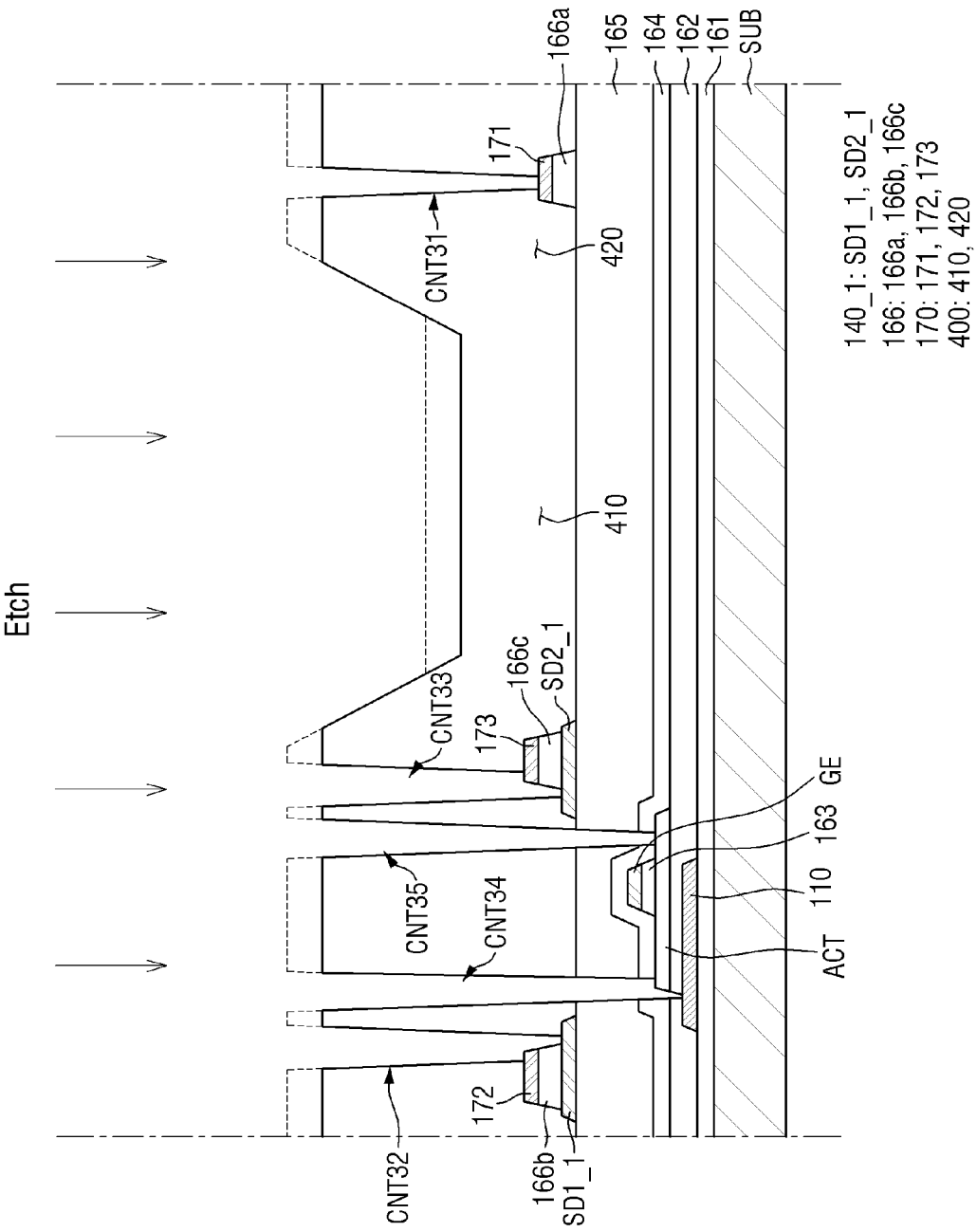

Subsequently, referring to FIG. 22, contact holes CNT31, CNT32, CNT33, CNT34, and CNT35 are formed using the patterned first via layer 400' as an etching mask. The contact holes CNT31, CNT32, CNT33, CNT34, and CNT35 may be formed through an etching process using the patterned first via layer 400' as an etching mask without a separate mask process.

Figure 21:
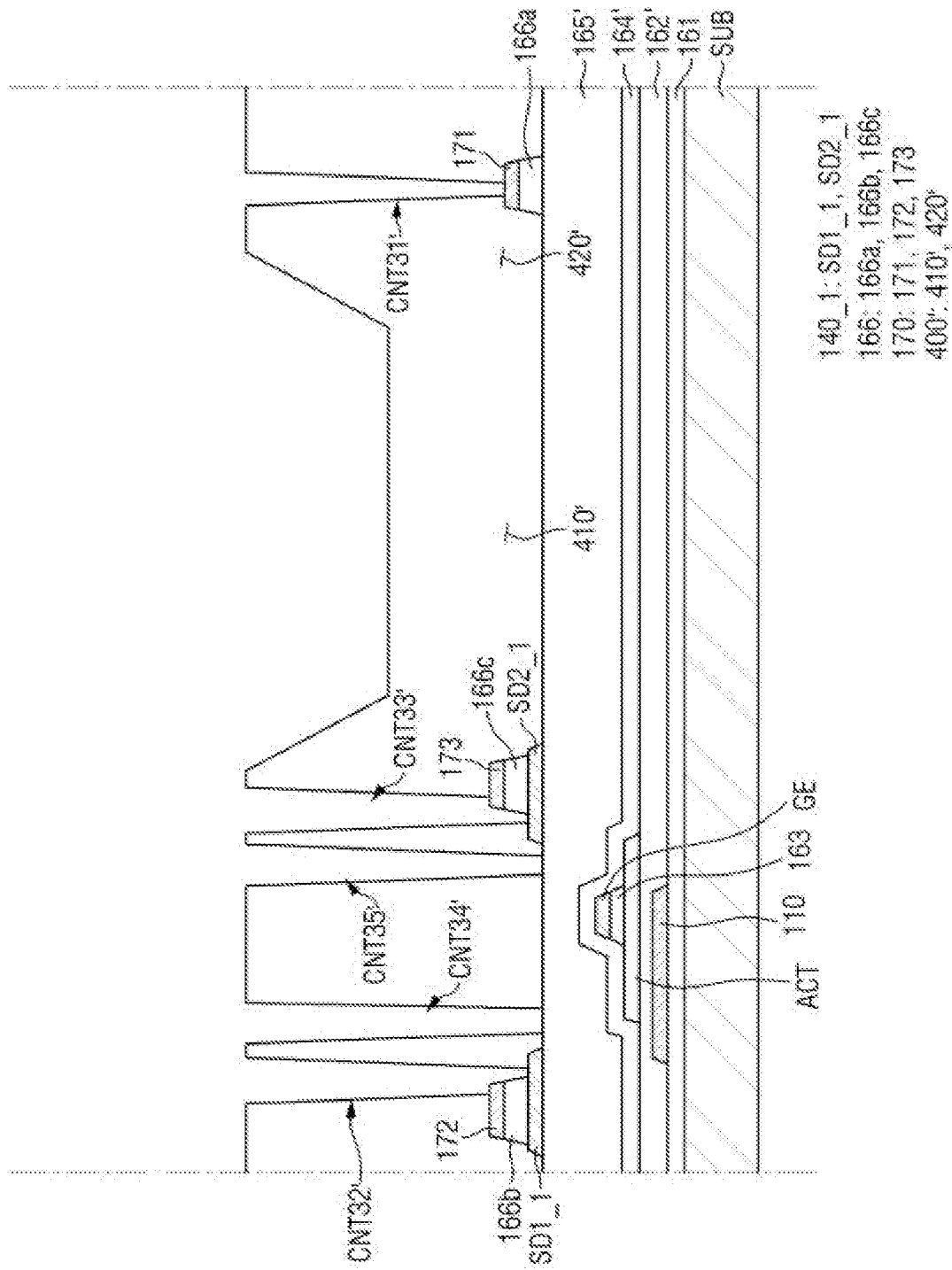

The material layers 164' and 165' for first and second interlayer insulating layers and the material layer 162' for a buffer layer exposed by the fourth opening CNT34' of FIG. 21 are etched through this etching process to form the fourth contact hole CNT34 exposing the active material layer ACT of the transistor TR and the lower metal layer 110.

Further, the material layers 164' and 165' for first and second interlayer insulating layers exposed by the fifth opening CNT35' of FIG. 21 are etched through this etching process to form the fifth contact hole CNT35 exposing the active material layer ACT of the transistor TR. In an embodiment, the etching process of forming the contact holes CNT31, CNT32, CNT33, CNT34, and CNT35 may be performed by a dry etching process.

This process may be performed by overall etching using the first via layer 400'. Through this process performed without a separate etching mask, the first via layer 400' is exposed to overall etching, and thus the height (or thickness) of the first via layer 400' is reduced overall, so that, as shown in FIG. 22, a patterned via layer 400 including the contact holes CNT31, CNT32, CNT33, CNT34, and CNT35 may be formed.

Figure 23:
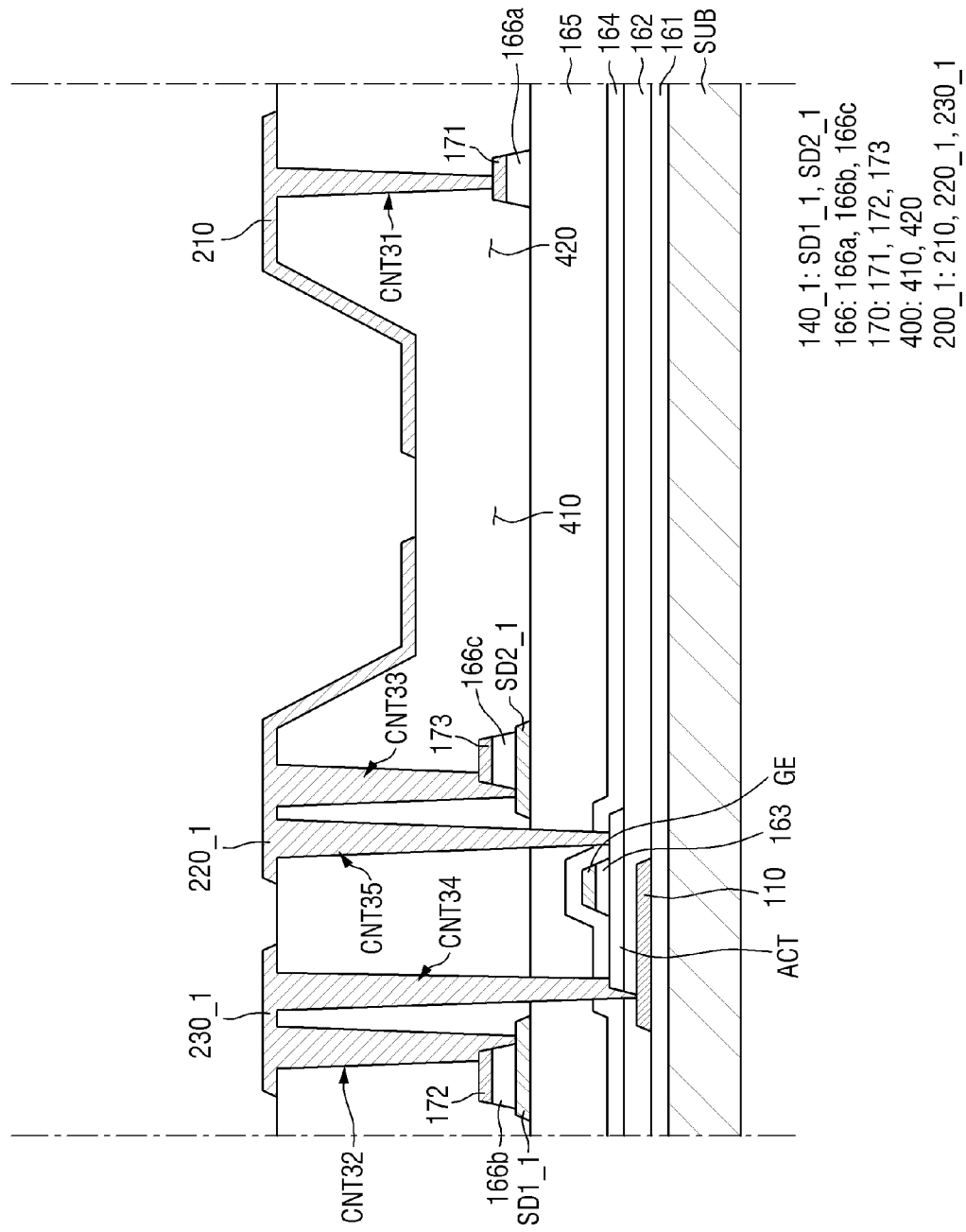

Subsequently, referring to FIG. 23, a patterned third conductive layer 200_1 may be formed on the patterned via layer 400. The patterned third conductive layer 200_1 may be formed by a mask process. For example, a material layer for a third conductive layer is entirely deposited on the via layer 400. In the deposition process, the material layer for a third conductive layer may be deposited to the insides of the first to fifth contact holes CNT31, CNT32, CNT33, CNT34, and CNT3, so that the material layer for a third conductive layer may be connected to a part of the lower metal layer 110, a part of the semiconductor layer, a part of the first conductive layer 140_1, and a part of the second conductive layer 170.

In the deposition process, the material layer for a third conductive layer may be deposited up to the first contact hole CNT31, so that the material layer for a third conductive layer may be connected to the first power line 171 of the second conductive layer 170. The material layer for a third conductive layer deposited up to the first contact hole CNT31 may contact the upper surface of the first power line 171.

The material layer for a third conductive layer may be deposited up to the second contact hole CNT32, so that the material layer for a third conductive layer may be connected to the first source/drain electrode SD1_1 of the first conductive layer 140_1 and the second power line 172 of the second conductive layer 170. The material layer for a third conductive layer deposited up to the second contact hole CNT32 may contact the upper surface and a sidewall of the second power line 172, a sidewall of the second region 166*b* of the passivation layer 166 aligned in parallel with a sidewall of the second power line 172, and the upper surface of the first source/drain electrode SD1_1.

The material layer for a third conductive layer may be deposited up to the fourth contact hole CNT34, so that the material layer for a third conductive layer may be connected to the active layer (active material layer) ACT of the transistor TR included in the semiconductor layer and the lower metal layer 110. The material layer for a third conductive layer deposited up to the fourth contact hole CNT34 may contact the upper surface and a sidewall of the active material layer ACT of the transistor TR, a sidewall of the buffer layer 162 aligned in parallel with a sidewall of the active material layer ACT, and the upper surface of the lower metal layer 110.

The material layer for a third conductive layer may be deposited up to the third contact hole CNT33, so that the material layer for a third conductive layer may be connected to the second source/drain electrode SD2_1 of the first conductive layer 140_1 and the first conductive pattern 173 of the second conductive layer 170. The material layer for a third conductive layer deposited up to the third contact hole CNT33 may contact the upper surface and a sidewall of the first conductive pattern 173, a sidewall of the third region 166*c* of the passivation layer 166 aligned in parallel with a sidewall of the first conductive pattern 173, and the upper surface of the second source/drain electrode SD21.

The material layer for a third conductive layer may be deposited up to the fifth contact hole CNT35, so that the material layer for a third conductive layer may be connected to the active material layer ACT of the transistor TR included in the semiconductor layer. The material layer for a third conductive layer deposited up to the fifth contact hole CNT35 may contact the upper surface of the active material layer ACT of the transistor TR.

Subsequently, a photoresist layer may be applied onto the material layer for a third conductive layer and is formed into a photoresist pattern having a pattern shape of the third conductive layer 200_1 to remain through exposure and development, and the material layer for a third conductive layer is etched using the photoresist pattern as an etching mask. Thereafter, the photoresist pattern is removed through a strip or ashing process to form a first electrode 210, a second electrode 220_1, and a connection pattern 230_1 as shown in FIG. 23.

Figure 24:
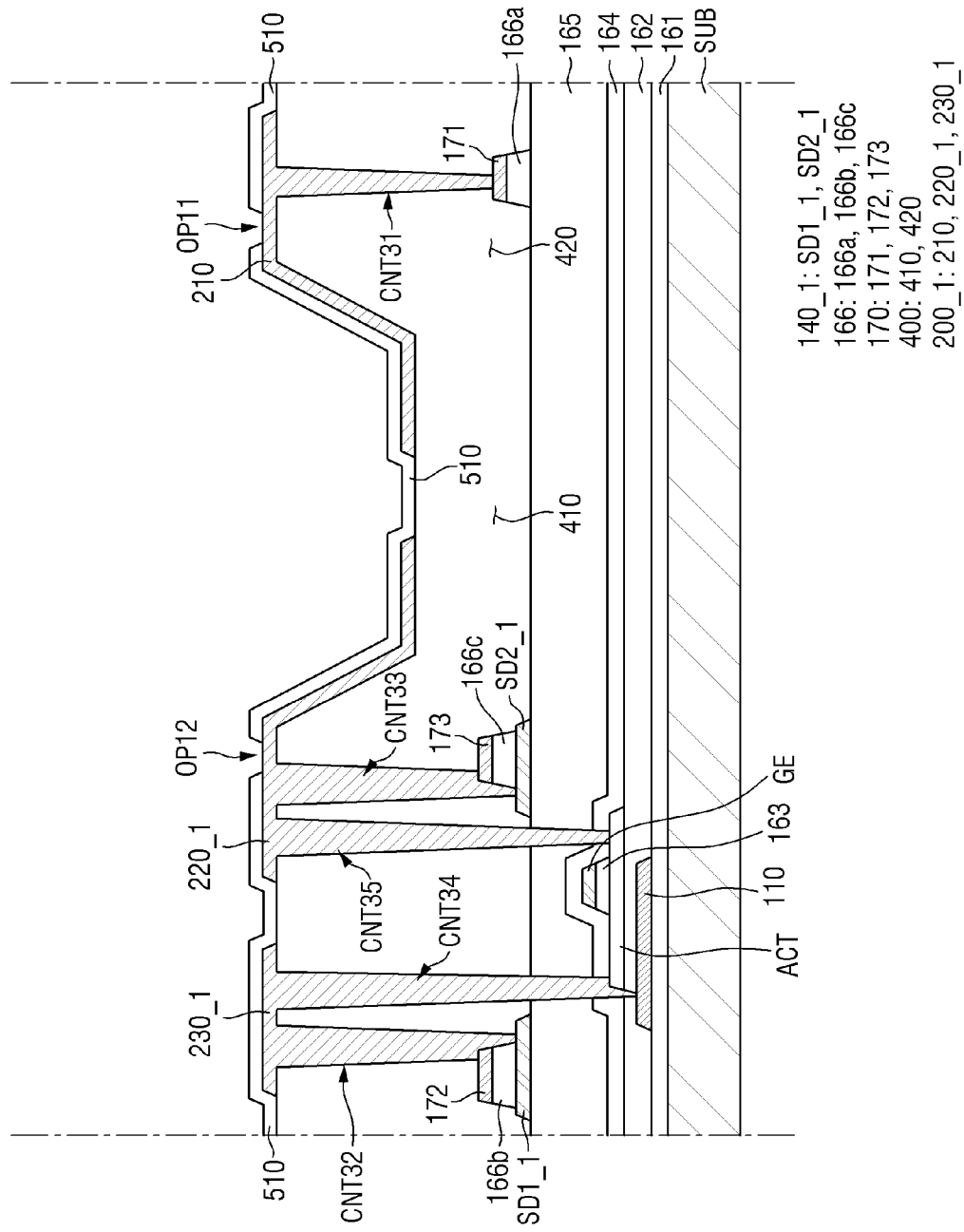

Subsequently, referring to FIG. 24, a patterned first insulating layer 510 may be formed on the patterned third conductive layer 200_1. The patterned first insulating layer 510 may be formed by a mask process described above with reference to FIG. 17 and will not be repeated.

Subsequently, as shown in FIG. 18, a first bank 600, a light emitting element ED, a second insulating layer 520, a first contact electrode 710, a third insulating layer 530, a second contact electrode 720, and a fourth insulating layer 540 may be formed through further processes.

Figure 25:
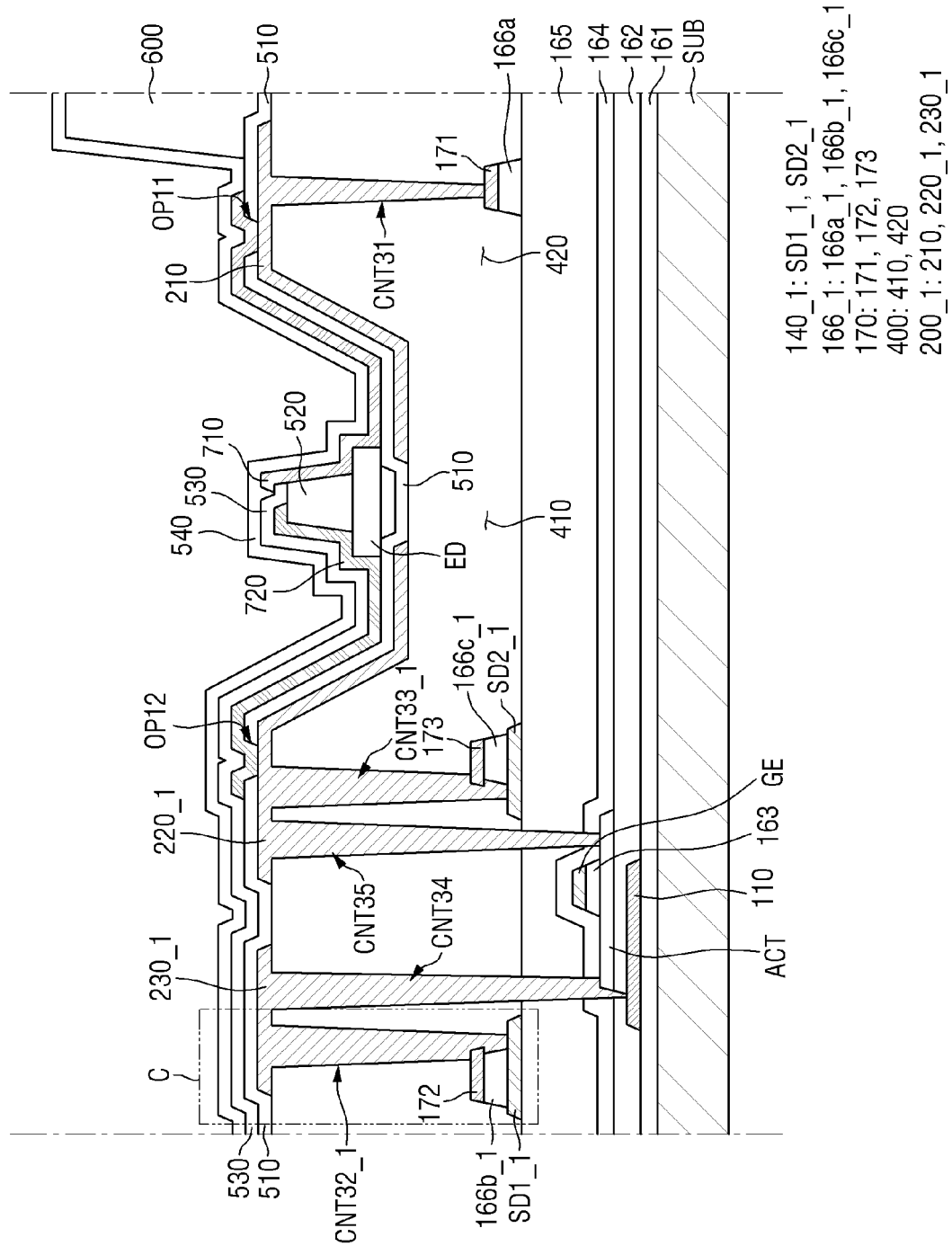
FIG. 25 is a schematic cross-sectional view of a display device according to an embodiment.
Figure 26:
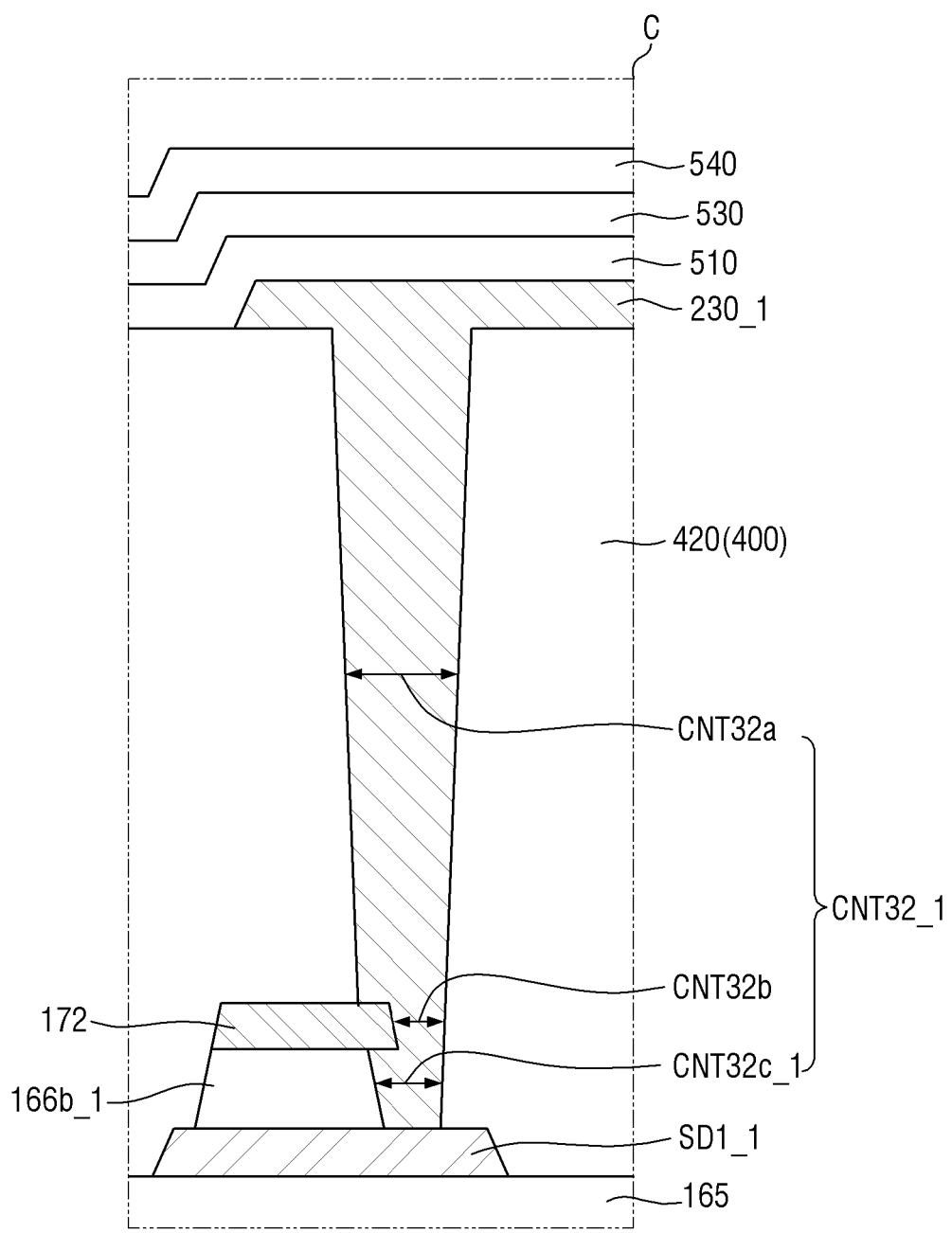
FIG. 26 is an enlarged schematic cross-sectional view illustrating another example of the area C of FIG. 25.

FIG. 25 is a cross-sectional view of a display device according to an embodiment. FIG. 26 is an enlarged cross-sectional view illustrating another example of the area C of FIG. 25.

Referring to FIGS. 25 and 26, the embodiment is different from the embodiment of FIG. 18 in that the sidewall of a part of a patterned passivation layer 166_1 is aligned inward from the sidewall of the second conductive layer 170.

The sidewall of the passivation layer 166_1 disposed under the second conductive layer 170 overlapping the patterned first conductive layer 140_1 in the third direction DR3 may not be parallel to the sidewall of the second conductive layer 170.

The sidewall of the second power line 172 exposed by the second contact hole CNT32_1 may not be parallel to the sidewall of the second region 166*b*_1 of the passivation layer 166_1 disposed under the second power line 172. The sidewall of the second region 166*b*_1 of the passivation layer 166_1 may be aligned inward from the sidewall of the second power line 172. Further, the sidewall of the first conductive pattern 173 exposed by the third contact hole CNT33_1 may not be parallel to the sidewall of the third region 166*c*_1 of the passivation layer 166_1 disposed under the first conductive pattern 173. The sidewall of the third region 166c_1 of the passivation layer 166_1 may be aligned inward from the sidewall of the first conductive pattern 173.

In the embodiment, the width of the first portion CNT32a of the second contact hole CNT32_1 may be greater than the widths of the second and third portions CNT32b and CNT32c_1 of the second contact hole CNT32. The width of the second portion CNT32b of the second contact hole CNT32_1 may be smaller than the widths of the first portion CNT32a and third portion CNT32c_1 of the second contact hole CNT32_1. The sidewall of the second portion CNT32b of the second contact hole CNT32_1 may protrude outward from the sidewall of the third portion CNT32c_1 of the second contact hole CNT32_1.

The structure of this embodiment may be formed in the process of forming the contact holes CNT31, CNT32, CNT33, CNT34, and CNT35 through etching (for example, isotropic etching) using the first via layer 400' described above with reference to FIGS. 21 and 22 as an etching mask. The second and third regions 166b and 166c of the passivation layer 166, respectively exposed by the second and third openings CNT32' and CNT33', may be exposed to an etchant used in the etching process for forming the contact holes to be partially etched. Accordingly, as shown in FIGS. 25 and 26, a structure in which a part of the sidewall of the passivation layer 166_1 is aligned inward from the sidewall of the second conductive layer 170 may be formed.

Figure 27:
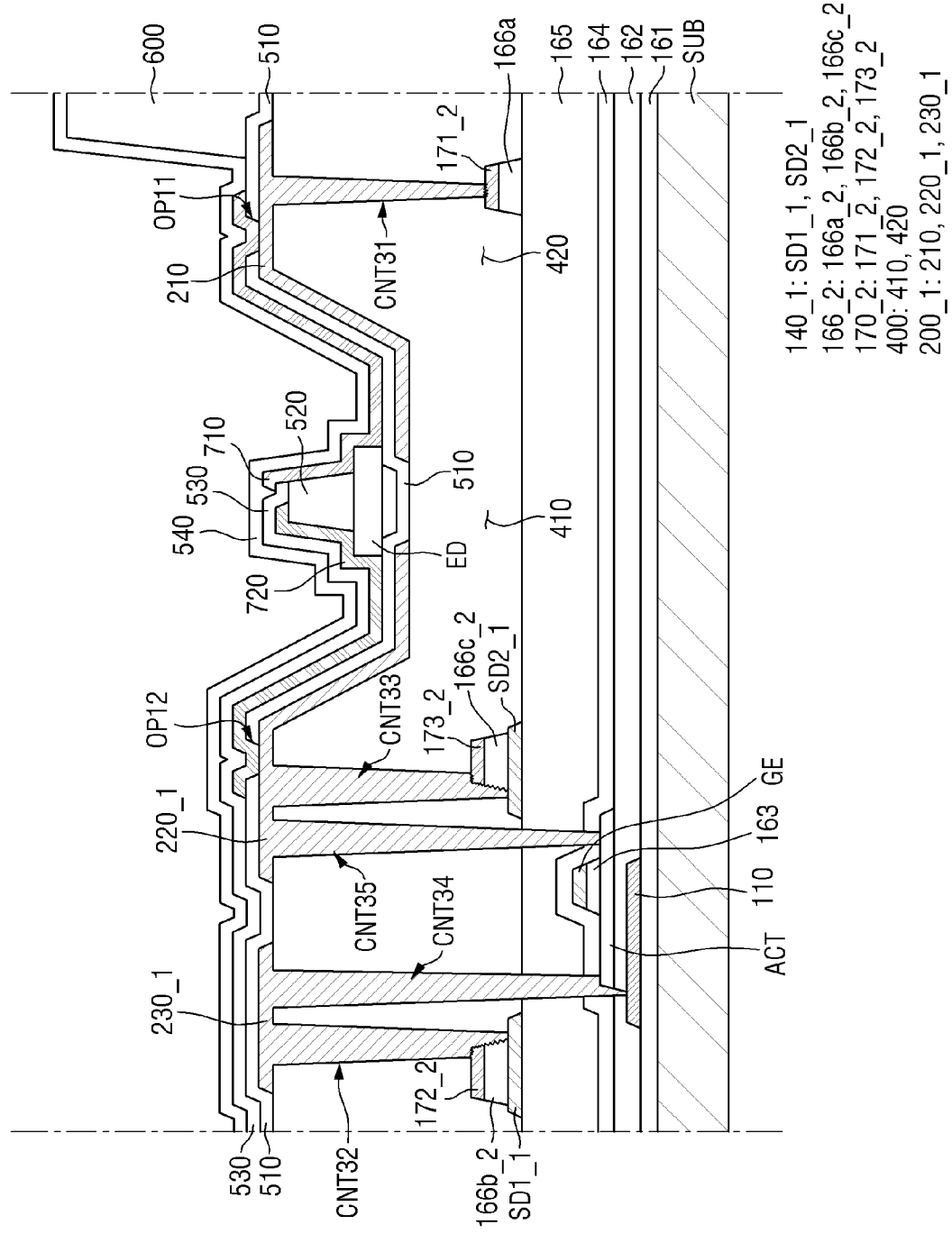
FIG. 27 is a schematic cross-sectional view of a display device according to an embodiment.

FIG. 27 is a cross-sectional view of a display device according to an embodiment.

Referring to FIG. 27, the embodiment is different from the embodiment of FIG. 18 in that a roughness is formed on the surfaces of a part of a second conductive layer 170_2 and a part of a passivation layer 166_2, exposed by the first to third contact holes CNT31, CNT32, and CNT33.

As described above, the first to third contact holes CNT31, CNT32, and CNT33 may expose parts of the patterned first conductive layer 140_1 and the second conductive layer 170_2. Parts of the first conductive layer 140_1 and the second conductive layer 170_2 exposed by the first to third contact holes CNT31, CNT32, and CNT33 may have a surface roughness. The surface roughness may be formed by damage to parts of the surfaces of the first conductive layer 140_1 and the second conductive layer 170_2 exposed to an etchant used in the etching process for forming the contact holes (first to fifth contact holes CNT31, CNT32, CNT33, CNT34, and CNT35).

Figure 28:
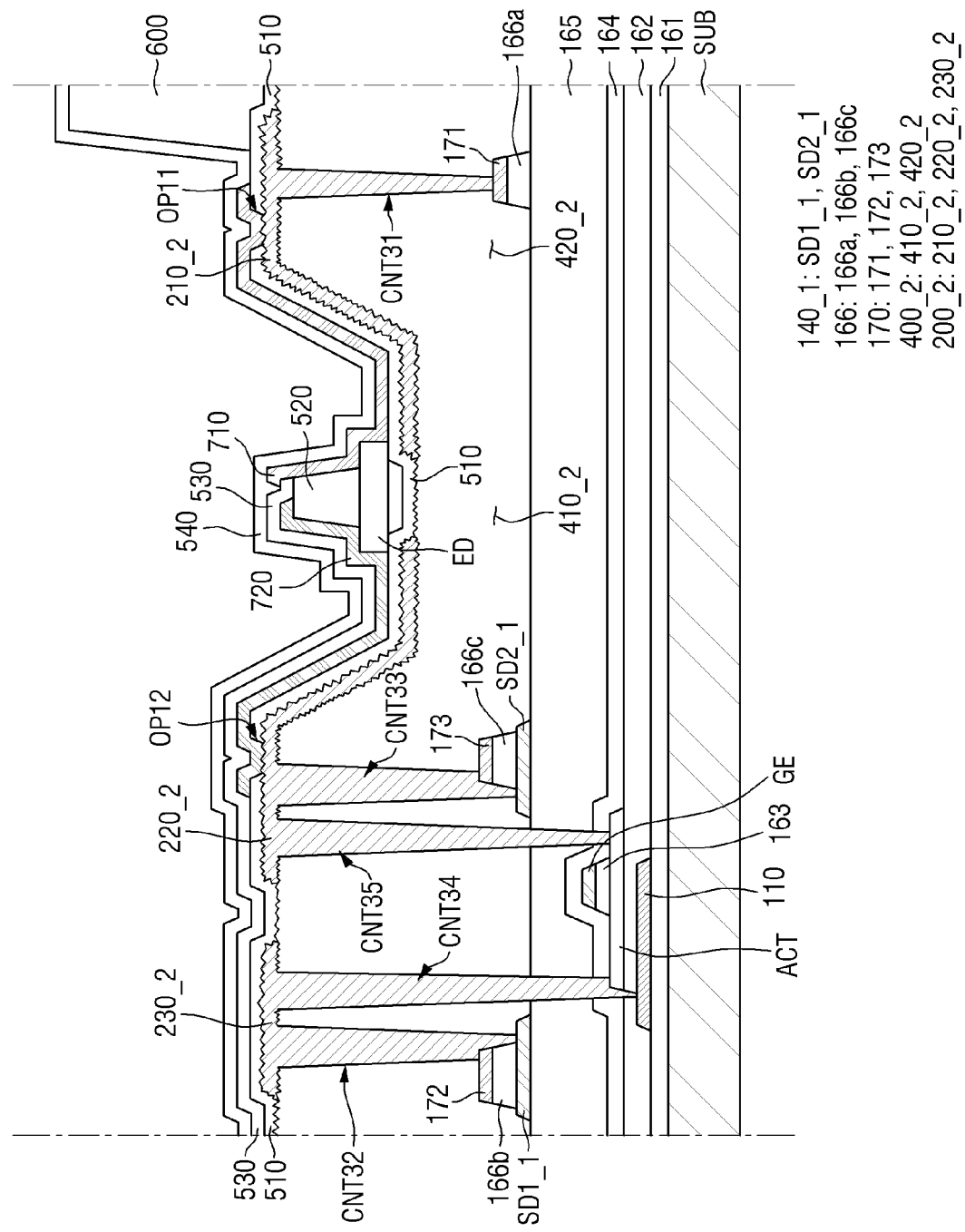
FIG. 28 is a schematic cross-sectional view of a display device according to an embodiment.

FIG. 28 is a cross-sectional view of a display device according to an embodiment.

Referring to FIG. 28, the embodiment is different from the embodiment of FIG. 18 in that a roughness is formed on the surface of a via layer 400_2 and the surface of a third conductive layer 200_2 disposed on the via layer 400_2. The surface of via layer 400_2 and the surface of the third conductive layer 200_2 may be rough.

A roughness may be formed on the surface of the via layer 400_2. Accordingly, a surface roughness may also be formed on the upper surface of the patterned third conductive layer 200_2 conformally formed on one surface of the via layer 400_2.

The structure of this embodiment may be formed in the process of forming the contact holes CNT31, CNT32, CNT33, CNT34, and CNT35 using the first via layer 400' described above with reference to FIGS. 21 and 22 as an etching mask. The contact holes CNT31, CNT32, CNT33, CNT34, and CNT35 may be formed by etching (for example, isotropic etching) using the patterned first via layer 400' of FIG. 22 as an etching mask without an additional mask process. The surface of the first via layer 400' may be partially damaged due to exposure to an etchant used in the above etching process to form via layer 400_2 having a thickness on the surface of the first via layer 400' as shown in FIG. 28.

Light emitted from the light emitting element ED and traveling toward the first electrode 210 and the second electrode 220_2 may be diffusely reflected by the surface roughness formed on the surfaces of the first and second electrodes 210 and 220_2 to reduce the occurrence of total reflection in the insulating layers, thereby improving the light efficiency of a display device.

Figure 29:
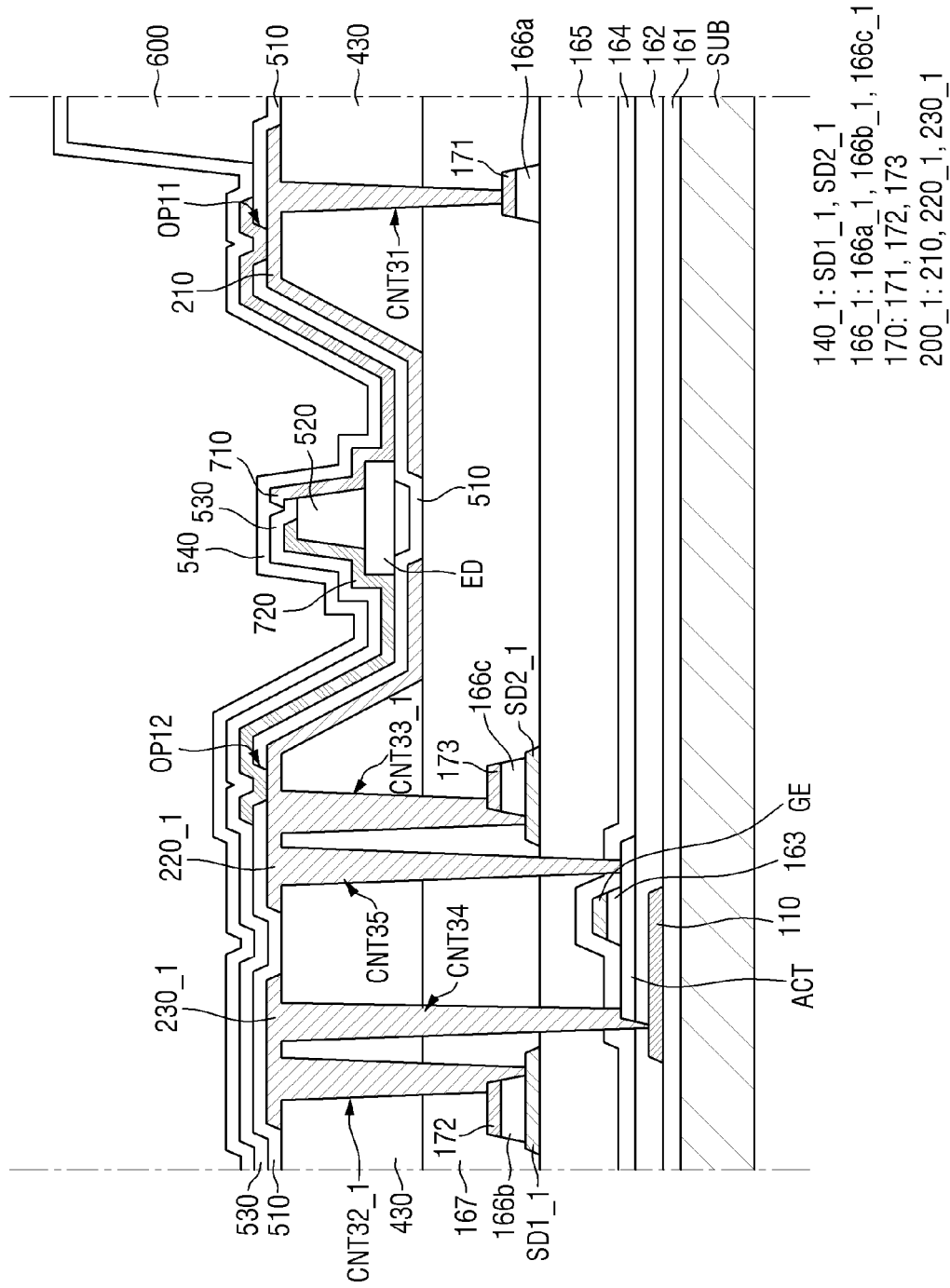
FIG. 29 is a schematic cross-sectional view of a display device according to an embodiment.

FIG. 29 is a cross-sectional view of a display device according to an embodiment.

Referring to FIG. 29, the embodiment is different from the embodiment of FIG. 18 in that a via layer 167 in which a step is not formed for each region, and a second bank 430 disposed between the third conductive layer 200_1 and the via layer 167 are provided.

The via layer 167 may be disposed on the second conductive layer 170. The via layer 167 according to the embodiment may have the same height for each region. The via layer 167 may have a substantially flat surface regardless of the shape or presence or absence of a pattern disposed thereunder. The via layer 167 may planarize a surface formed by multiple layers disposed thereunder.

The second bank 430 may be disposed on the via layer 167. The second banks 430 may be disposed on the via layer 167 to be spaced apart from each other in the first direction DR1. The cross-sectional shape of the second bank 430 may be the same as the cross-sectional shape of the second region 420 of the via layer 400 described above with reference to FIG. 18. The second bank 430 may provide an area in which light emitting elements ED are arranged, and at the same time serve as a reflective partition wall that changes the traveling direction of light emitted from the light emitting element ED to a display direction.

The third conductive layer 200_1 may be disposed on the second bank 430 and the via layer 167 exposed by the second bank 430. The first electrode 210 and second electrode 220_1 of the third conductive layer 200_1 may be disposed on the via layer 167 exposed by the second bank 430 to be spaced apart from each other in the first direction DR1. The second bank 430 may include an organic insulating material, for example, an organic material such as polyimide (PI).

The second bank 430 may be formed through a separate mask process after forming the patterned via layer 167. Therefore, in the embodiment, a mask process for forming the second bank 430 may be additionally performed.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. A display device, comprising:
a substrate that includes a display area and a non-display area NDA outside the display area;

a first conductive layer disposed on the substrate, the first conductive layer including a first source/drain electrode of a transistor;
a passivation layer disposed on the first conductive layer and exposing at least a part of the first conductive layer in the display area;
a second conductive layer disposed on the passivation layer and covering an upper surface of the passivation layer in the display area;
a via layer disposed on the second conductive layer;
a third conductive layer including a first electrode, a second electrode, and a connection pattern spaced apart from each other on the via layer; and
a light emitting element having ends that are disposed on the first electrode and the second electrode, respectively, wherein
a first end of the light emitting element is electrically connected to the first electrode,
a second end of the light emitting element is electrically connected to the second electrode, and
the connection pattern electrically connects the first conductive layer and the second conductive layer through a first contact hole penetrating the via layer.

2. The display device of claim 1, wherein the first contact hole exposes at least a part of the first conductive layer and at least a part of the second conductive layer.

3. The display device of claim 2, wherein the first contact hole exposes an upper surface of the second conductive layer and a sidewall of the second conductive layer.

4. The display device of claim 3, wherein the first contact hole exposes a sidewall of the passivation layer disposed between the first conductive layer and the second conductive layer.

5. The display device of claim 4, wherein the first contact hole exposes an upper surface of the first conductive layer.

6. The display device of claim 1, wherein at least a part of the second conductive layer and at least a part of the passivation layer overlap the first conductive layer.

7. The display device of claim 6, wherein the second conductive layer exposes at least a part of the first conductive layer.

8. The display device of claim 1, wherein a sidewall of the second conductive layer is aligned in parallel to a sidewall of the passivation layer.

9. The display device of claim 1, wherein the first contact hole includes:
a first portion formed by a sidewall of the via layer;
a second portion formed by a sidewall of the second conductive layer and the sidewall of the via layer; and
a third portion formed by a sidewall of the passivation layer and the sidewall of the via layer, and
the first portion of the first contact hole, the second portion of the first contact hole, and the third portion of the first contact hole overlap each other in a thickness direction of the substrate.

10. The display device of claim 9, wherein a width of the first portion of the first contact hole is greater than a width of the second portion of the first contact hole and greater than a width of the third portion of the first contact hole.

11. The display device of claim 9, wherein the first portion of the first contact hole, the second portion of the first contact hole, and the third portion of the first contact hole are integral with each other and form one hole.

12. A display device, comprising:
a first conductive layer disposed on a substrate;
a passivation layer disposed on the first conductive layer and exposing at least a part of the first conductive layer;
a second conductive layer disposed on the passivation layer and covering an upper surface of the passivation layer;
a via layer disposed on the second conductive layer;
a third conductive layer including a first electrode, a second electrode, and a connection pattern spaced apart from each other on the via layer; and
a light emitting element having ends that are disposed on the first electrode and the second electrode, respectively, wherein
the connection pattern electrically connects the first conductive layer and the second conductive layer through a first contact hole penetrating the via layer, the first contact hole includes:
a first portion formed by a sidewall of the via layer;
a second portion formed by a sidewall of the second conductive layer and the sidewall of the via layer; and
a third portion formed by a sidewall of the passivation layer and the sidewall of the via layer,
the first portion of the first contact hole, the second portion of the first contact hole, and the third portion of the first contact hole overlap each other in a thickness direction of the substrate, and
the third portion of the first contact hole does not overlap the second conductive layer in the thickness direction of the substrate.

13. The display device of claim 1, wherein the passivation layer is disposed between the second conductive layer and the first conductive layer.

14. The display device of claim 1, further comprising:
a semiconductor layer disposed on the substrate;
a gate insulating layer disposed on the semiconductor layer;
a gate conductive layer disposed on the gate insulating layer; and
an interlayer insulating layer disposed on the gate conductive layer,
wherein the first conductive layer is disposed on the interlayer insulating layer.

15. The display device of claim 14, wherein
the semiconductor layer includes an active layer of the transistor, and
the first source/drain electrode of the transistor is electrically connected to the active layer of the transistor through a second contact hole penetrating the interlayer insulating layer.

16. The display device of claim 15, wherein the second contact hole overlaps the first source/drain electrode of the transistor and overlaps the active layer of the transistor.

17. The display device of claim 14, wherein
the first conductive layer includes a first source/drain electrode of a transistor,
the semiconductor layer includes an active layer of the transistor, and
the first source/drain electrode of the transistor is electrically connected to the active layer of the transistor through a second contact hole penetrating the via layer and the interlayer insulating layer.

18. The display device of claim 17, wherein the second contact hole does not overlap the first source/drain electrode of the transistor, and overlaps the active layer of the transistor.

19. The display device of claim 1, wherein the light emitting element has ends that are disposed directly over the first electrode and the second electrode, respectively.

* * * * *